United States Patent
Peng et al.

(10) Patent No.: US 9,620,203 B2
(45) Date of Patent: Apr. 11, 2017

(54) NONVOLATILE MEMORY INTEGRATED CIRCUIT WITH BUILT-IN REDUNDANCY

(71) Applicant: KABUSHIKI KAISHA TOSHIBA, Tokyo (JP)

(72) Inventors: Haiyang Peng, Kanagawa (JP); Koichiro Zaitsu, Kanagawa (JP); Shinichi Yasuda, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 14/849,047

(22) Filed: Sep. 9, 2015

(65) Prior Publication Data

US 2016/0078933 A1   Mar. 17, 2016

(30) Foreign Application Priority Data

Sep. 17, 2014 (JP) ................. 2014-188715

(51) Int. Cl.
*G11C 11/00* (2006.01)
*G11C 11/36* (2006.01)
(Continued)

(52) U.S. Cl.
CPC ........ *G11C 13/0002* (2013.01); *G11C 13/003* (2013.01); *G11C 13/0007* (2013.01);
(Continued)

(58) Field of Classification Search
USPC ........................................ 365/148, 163, 175
See application file for complete search history.

(56) References Cited

U.S. PATENT DOCUMENTS 7,760,545 B2 * 7/2010 Nakai ................... G11C 11/005
365/148
8,248,871 B2    8/2012 Park et al.
(Continued)

FOREIGN PATENT DOCUMENTS

JP    2008-181633    8/2008
JP    2010-182404    8/2010
(Continued)

OTHER PUBLICATIONS

Robson, N., et al., "Electrically Programmable Fuse (eFUSE): From Memory Redundancy to Autonomic Chips", IEEE, Custom Integrated Circuits Conference (2007) p. 799-804.
(Continued)

*Primary Examiner* — Trong Phan
(74) *Attorney, Agent, or Firm* — Finnegan, Henderson, Farabow, Garrett & Dunner LLP

(57) ABSTRACT

According to one embodiment, a semiconductor integrated circuit includes a memory cell including first and second electrodes and a resistance change film therebetween, and a control circuit controlling a potential difference between the first and second electrodes. The control circuit reversibly changes the memory cell to a first resistive state by applying a first potential to the first electrode and by applying a second potential smaller than the first potential to the second electrode. The control circuit reversibly changes the memory cell to a second resistive state by applying a third potential to the first electrode and by applying a fourth potential smaller than the third potential to the second electrode.

21 Claims, 21 Drawing Sheets

(51) Int. Cl.
*G11C 13/00* (2006.01)
*G11C 17/16* (2006.01)
*G11C 17/18* (2006.01)
*G11C 29/00* (2006.01)

(52) U.S. Cl.
CPC ........ *G11C 13/0069* (2013.01); *G11C 17/165* (2013.01); *G11C 17/18* (2013.01); *G11C 29/787* (2013.01); *G11C 2213/15* (2013.01); *G11C 2213/77* (2013.01); *G11C 2213/78* (2013.01); *G11C 2213/79* (2013.01)

(56) References Cited

U.S. PATENT DOCUMENTS

| | | | | |
|---|---|---|---|---|
| 8,369,131 | B2* | 2/2013 | Wang | G11C 13/0007 365/148 |
| 8,441,837 | B2* | 5/2013 | Ikeda | G11C 13/0007 365/148 |
| 8,531,869 | B2* | 9/2013 | Katoh | G11C 11/14 365/148 |
| 8,547,721 | B2* | 10/2013 | Ahn | H01L 27/24 365/148 |
| 8,665,632 | B2* | 3/2014 | Toda | G11C 13/0011 365/148 |
| 2007/0146012 | A1 | 6/2007 | Murphy et al. | |
| 2008/0149912 | A1 | 6/2008 | Nakai | |
| 2009/0134910 | A1 | 5/2009 | Murphy et al. | |
| 2010/0199028 | A1 | 8/2010 | Klausberger et al. | |
| 2011/0103132 | A1 | 5/2011 | Wei et al. | |
| 2014/0061765 | A1 | 3/2014 | Zaitsu et al. | |
| 2015/0214950 | A1 | 7/2015 | Yasuda et al. | |
| 2015/0244373 | A1 | 8/2015 | Matsumoto et al. | |
| 2015/0269972 | A1 | 9/2015 | Tatsumura | |

FOREIGN PATENT DOCUMENTS

| | | |
|---|---|---|
| JP | 2014-53374 | 3/2014 |
| JP | 2015-142175 | 8/2015 |
| JP | 2015-158955 | 9/2015 |
| JP | 2015-185180 | 10/2015 |
| WO | WO 2010/140296 A1 | 12/2010 |

OTHER PUBLICATIONS

Lin, Kuan-Liang, et al., "Low-Ireset Unipolar $HfO_2$ RRAM and Tunable Resistive-Switching Mode via Interface Engineering", ISDRS, Dec. 7-9, 2011. Retrieved from http://www.eee.umd.edu/ISDRS2011.

* cited by examiner

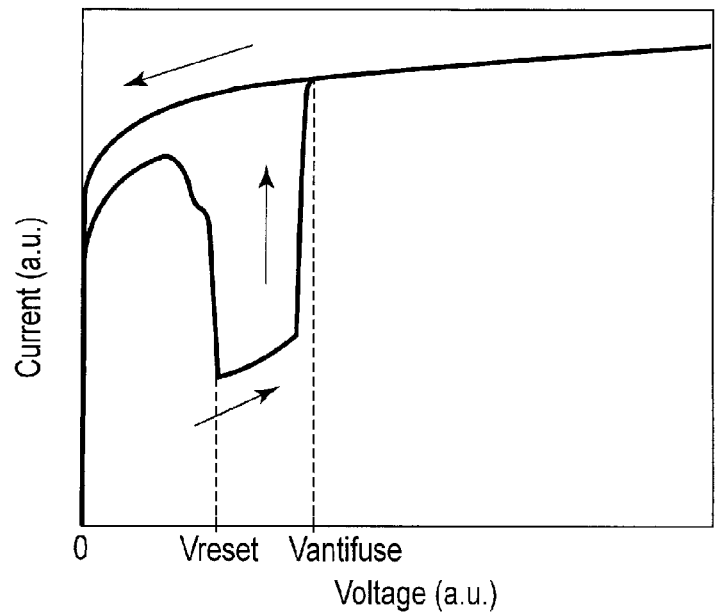
F I G. 7
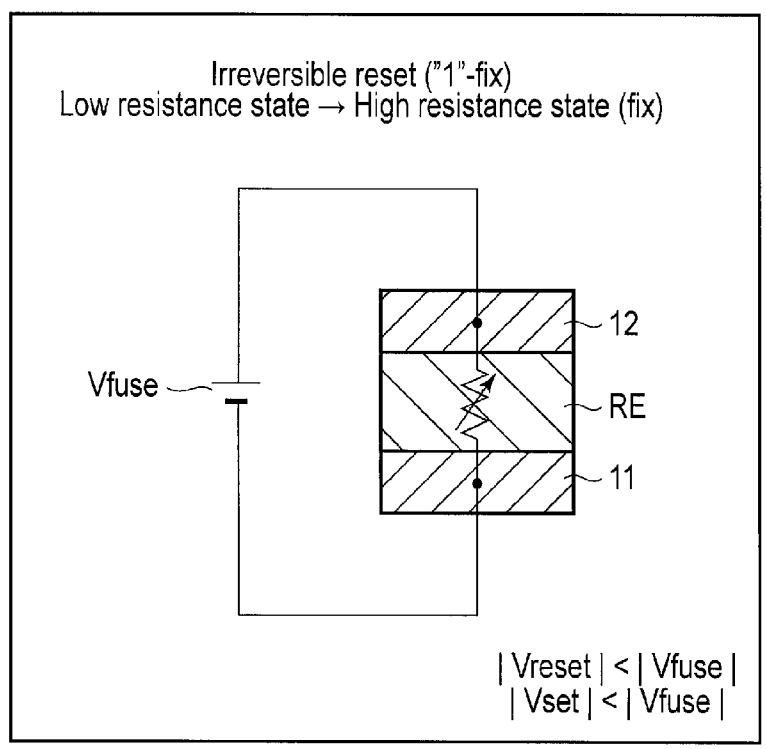
F I G. 8

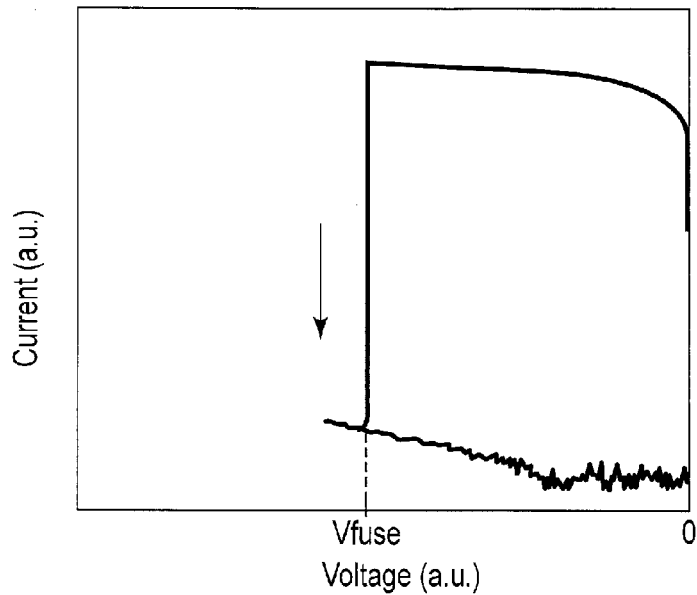
F I G. 9
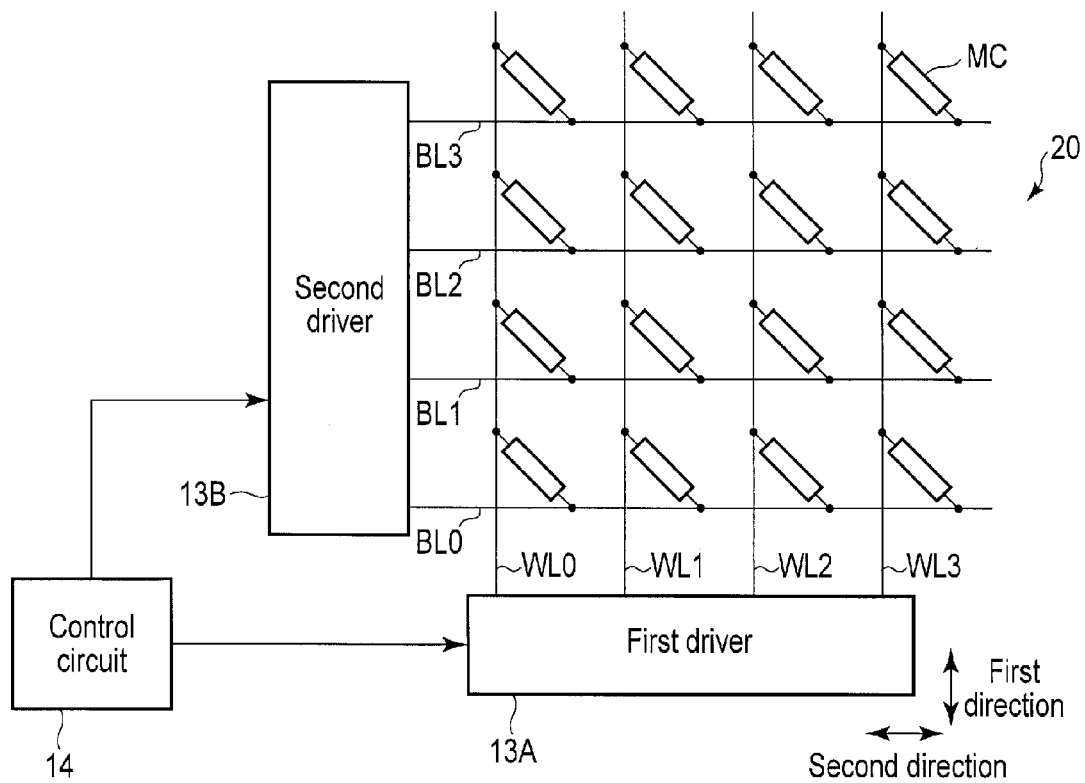
F I G. 10

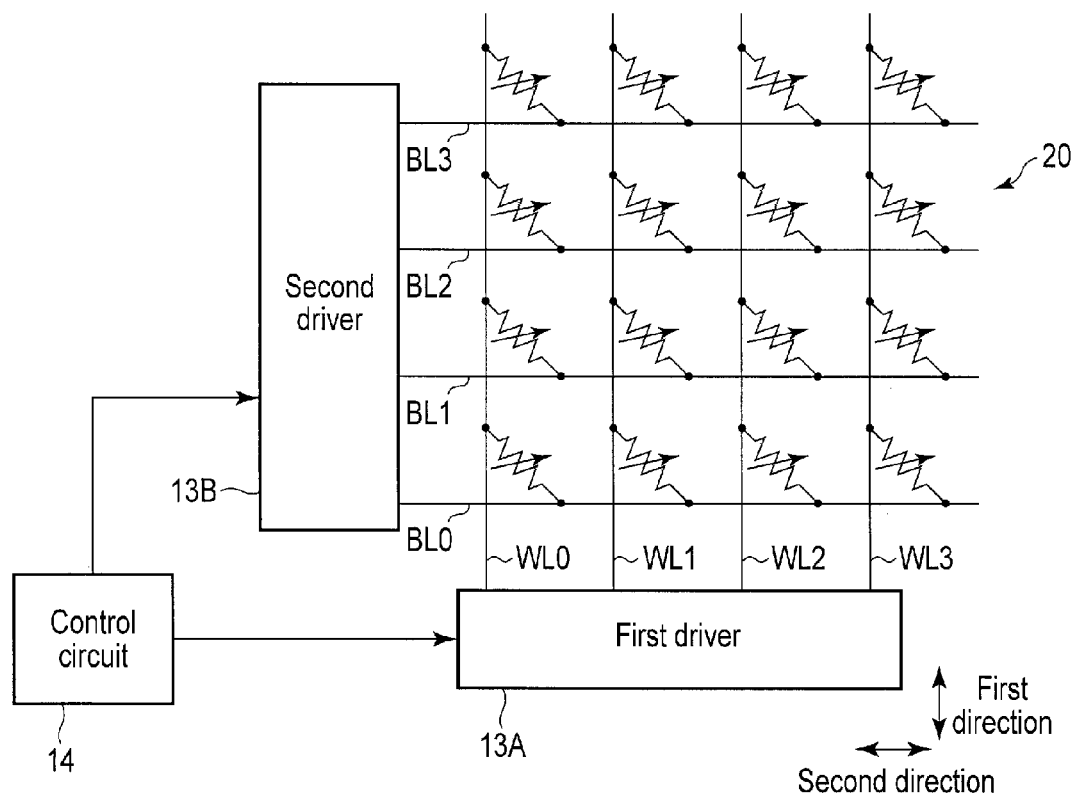
F I G. 11

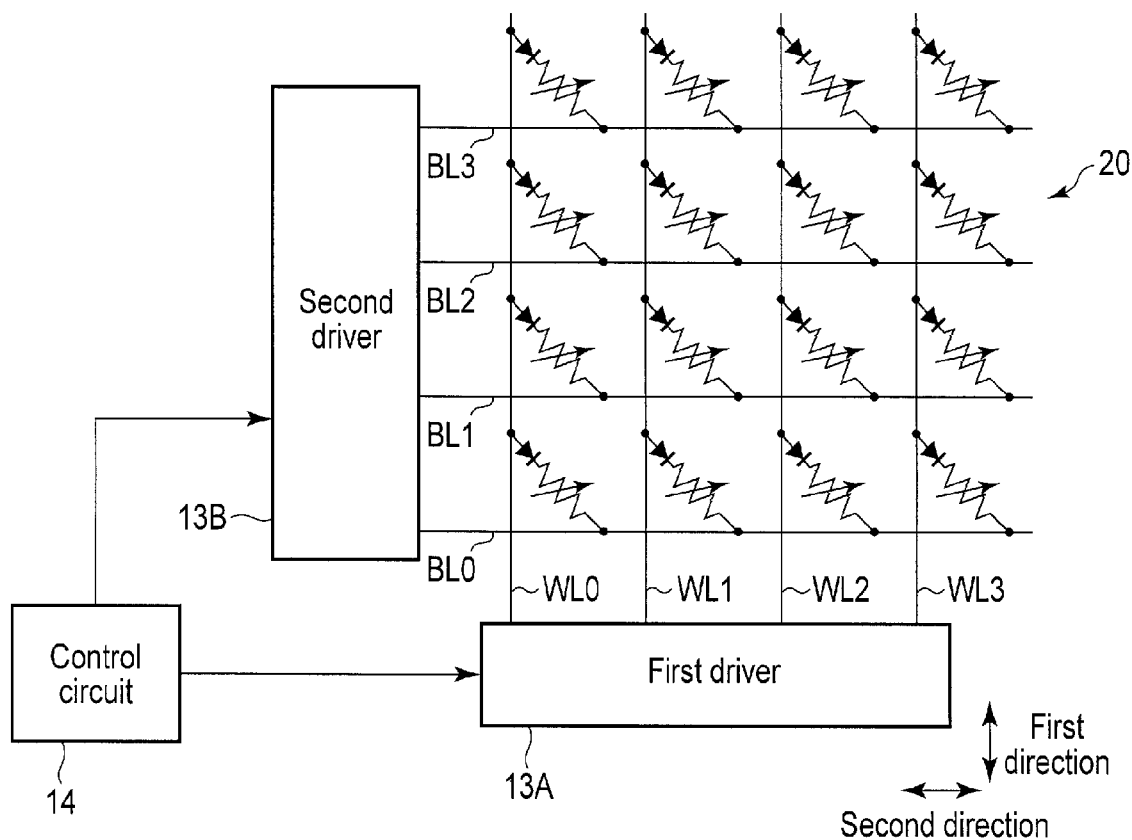
F I G. 12

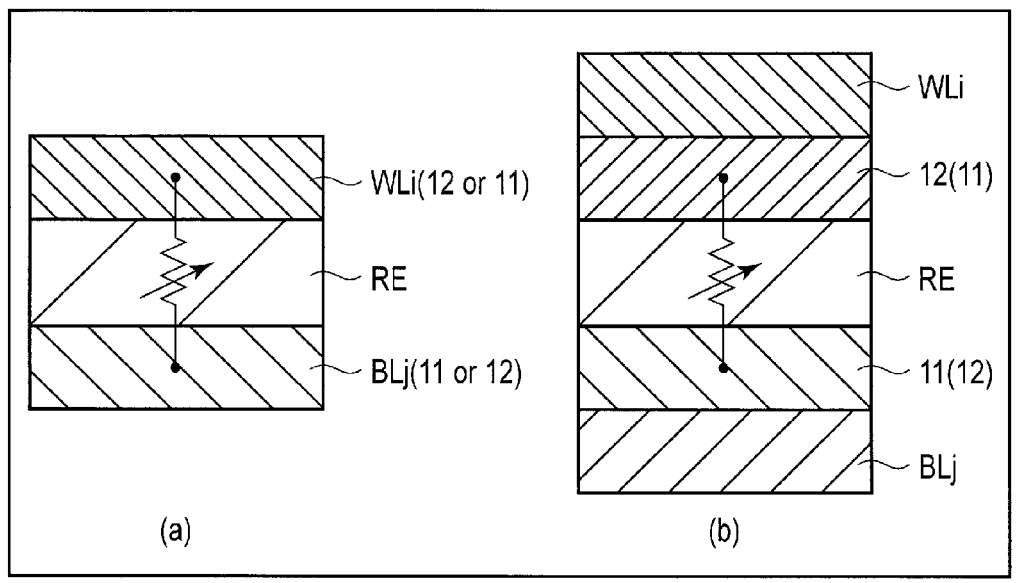
F I G. 14
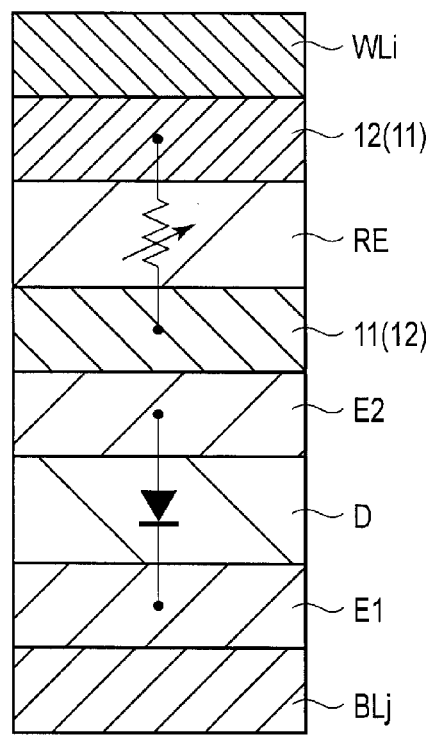
F I G. 15

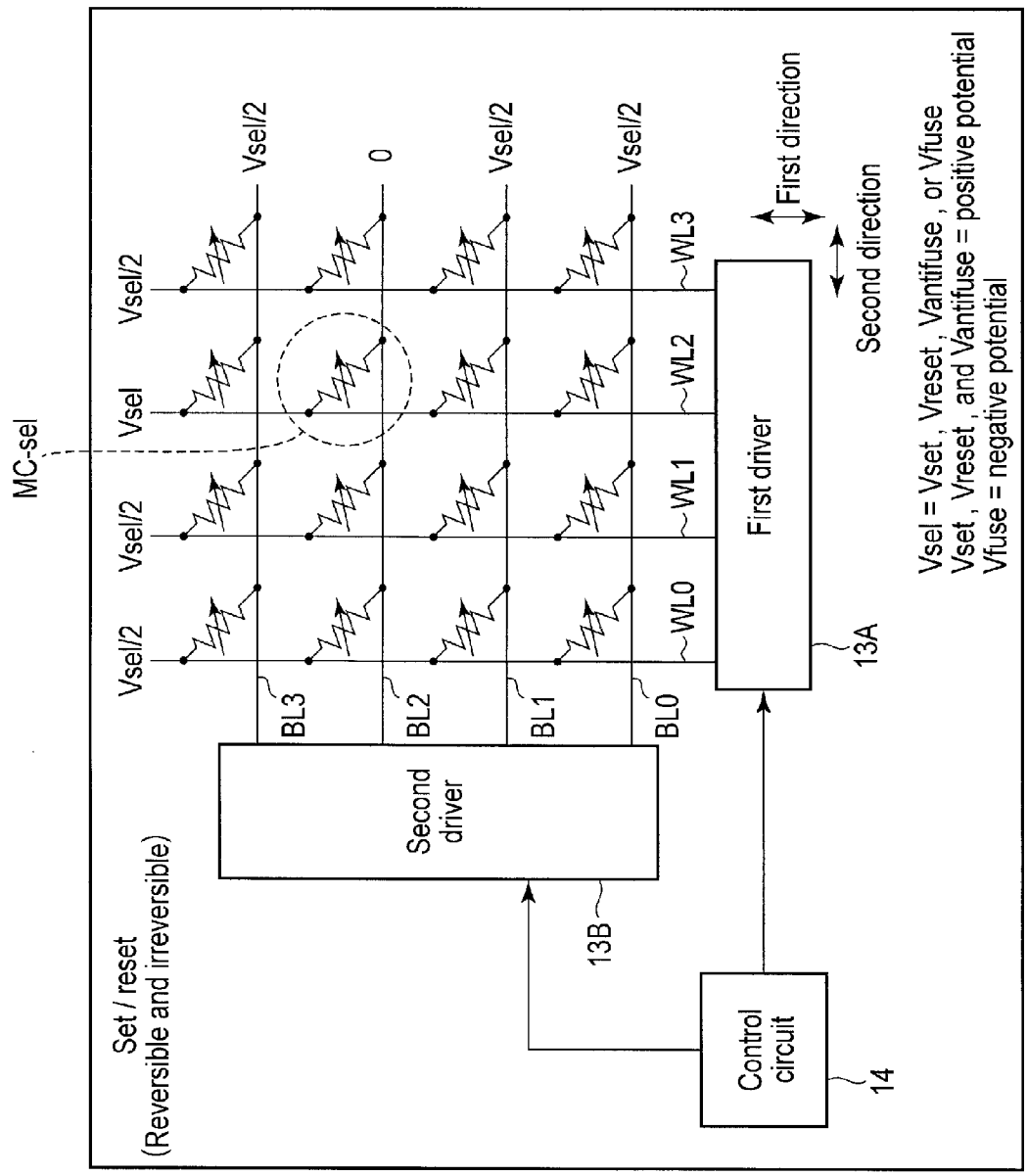
F I G. 16

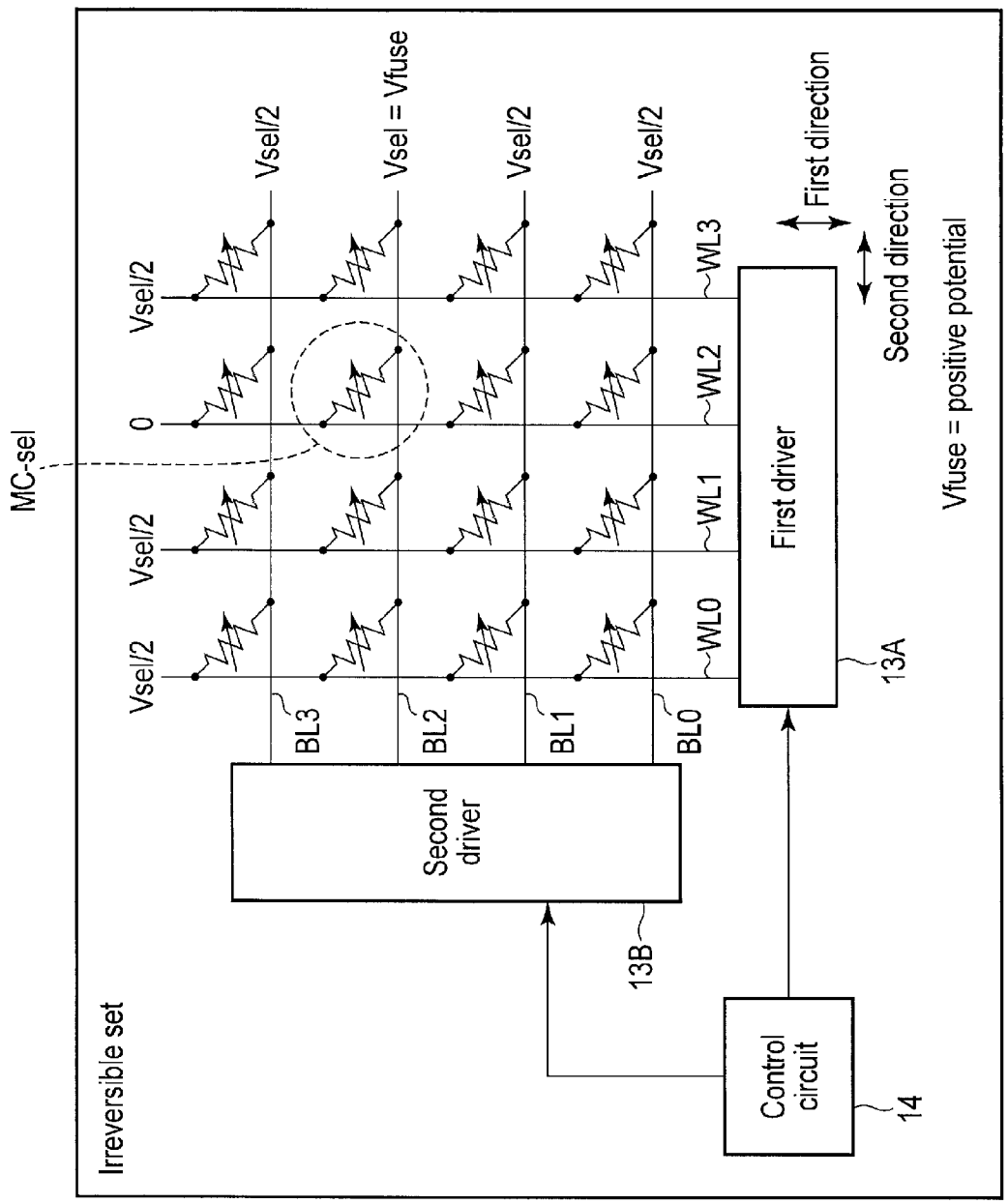
F I G. 17

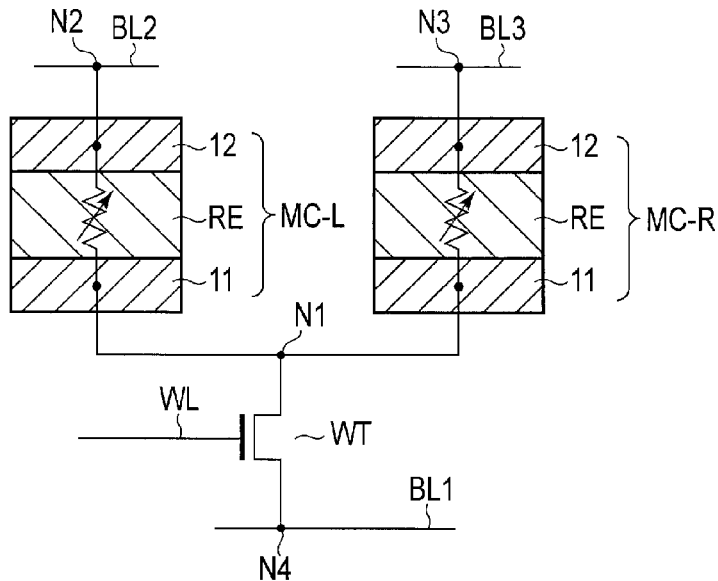
F I G. 21
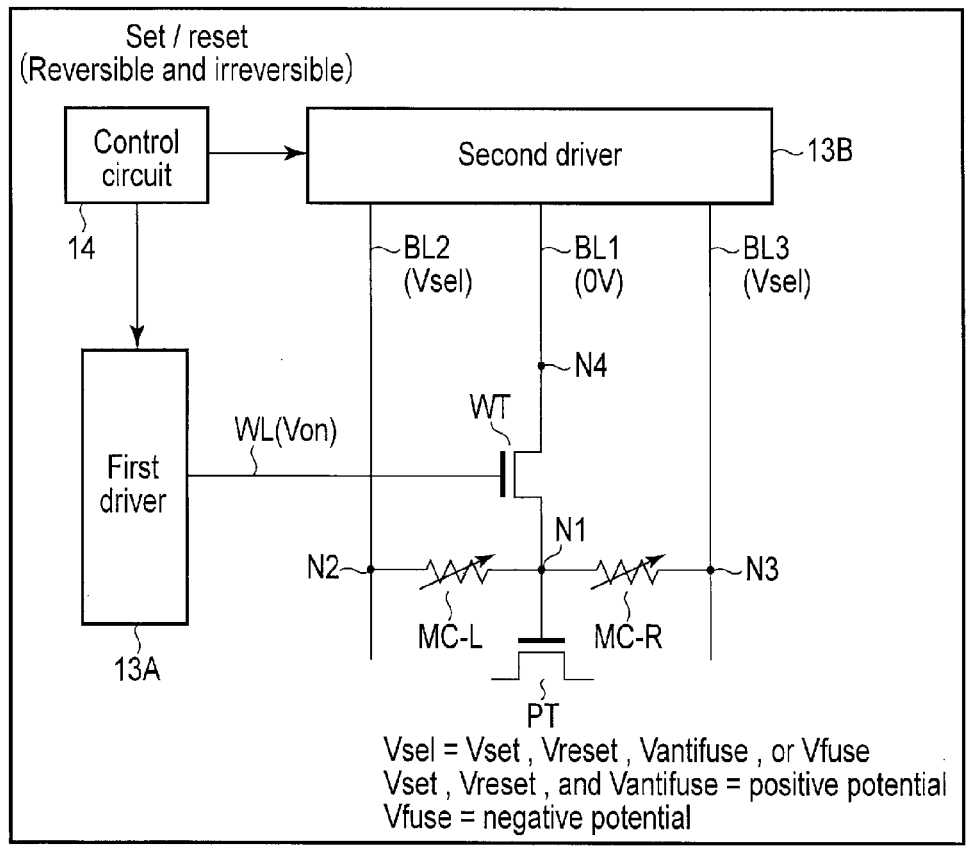
F I G. 22A

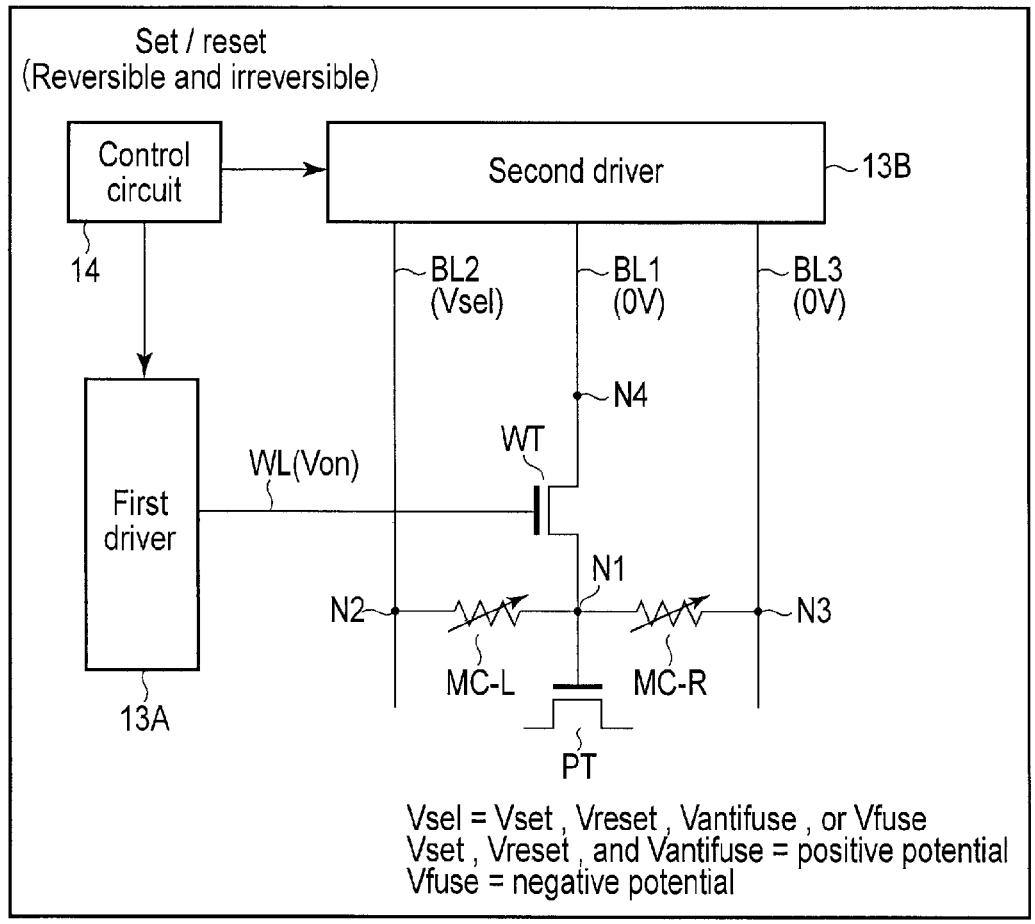
F I G. 22B

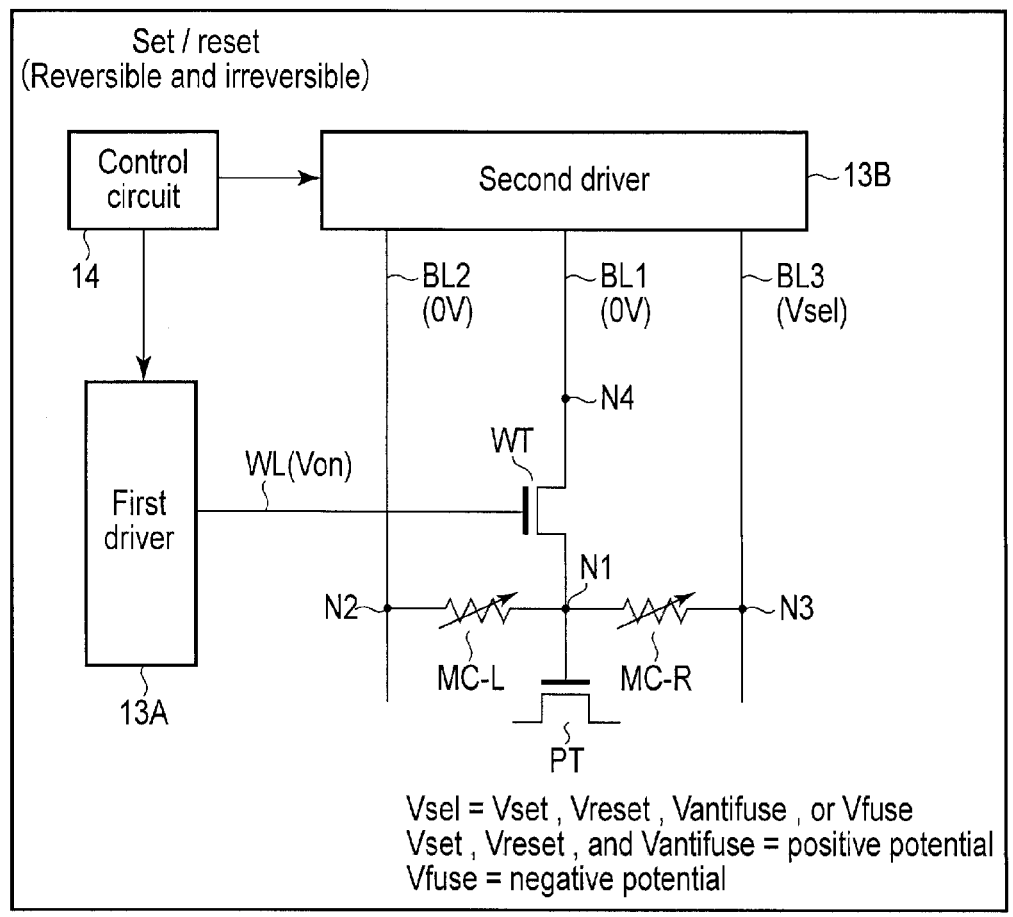
F I G. 22C

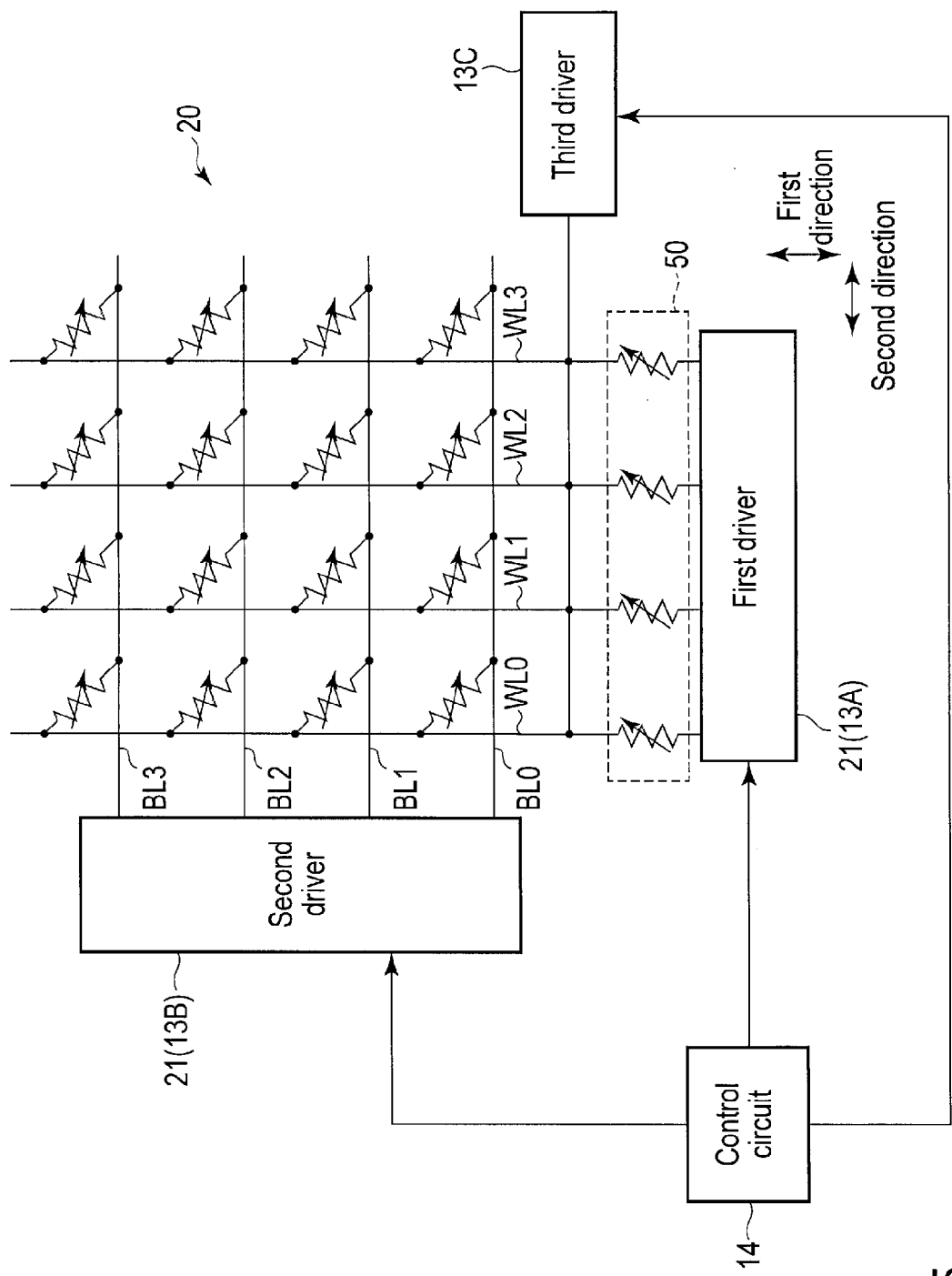
F I G. 25

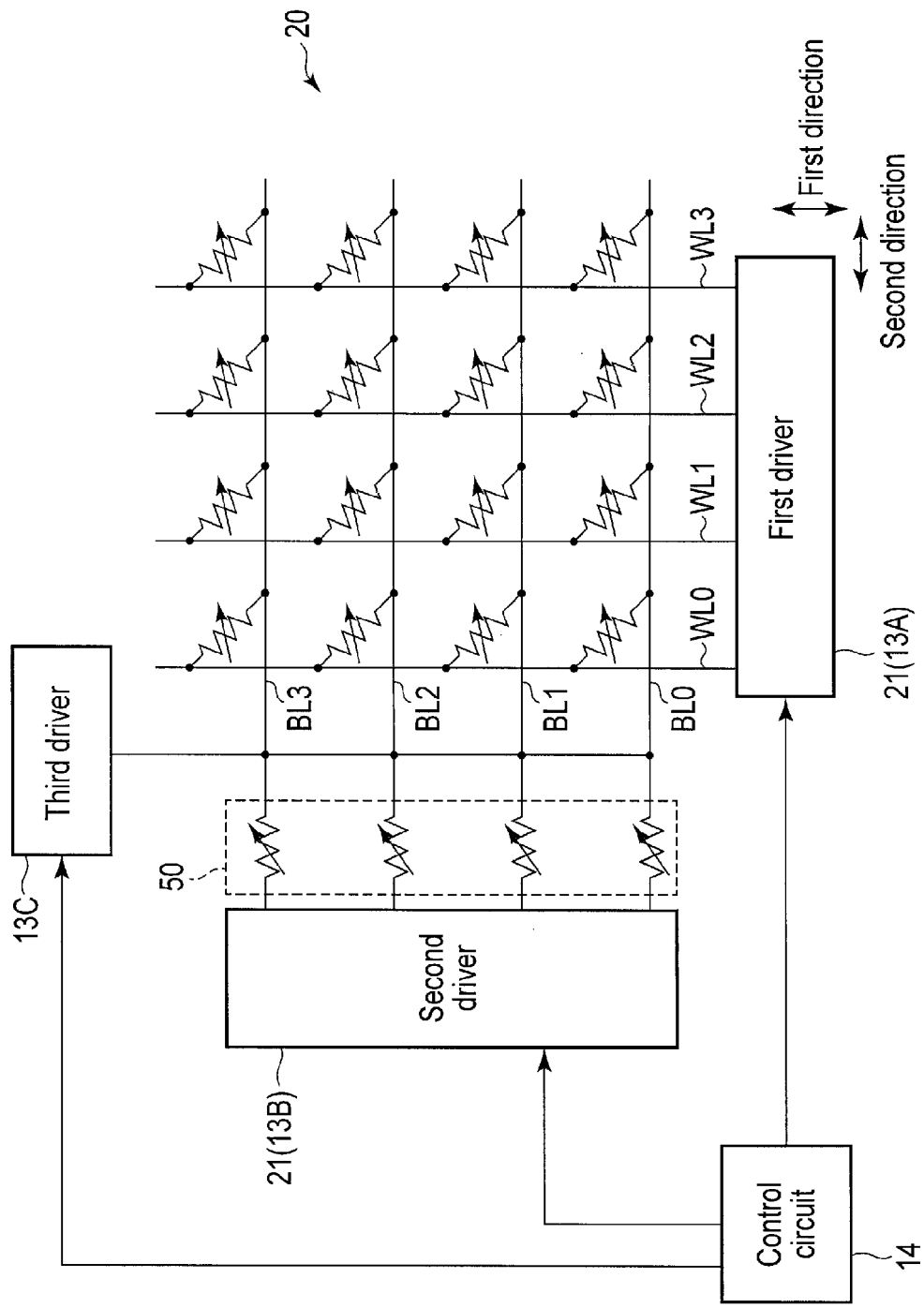
F I G. 27

NONVOLATILE MEMORY INTEGRATED CIRCUIT WITH BUILT-IN REDUNDANCY

CROSS-REFERENCE TO RELATED APPLICATIONS

This application is based upon and claims the benefit of priority from Japanese Patent Application No. 2014-188715, filed Sep. 17, 2014, the entire contents of which are incorporated herein by reference.

FIELD

Embodiments described herein relate generally to a semiconductor integrated circuit.

BACKGROUND

Recently, a resistance change memory using a resistance change film as a memory cell has been noted as a next-generation nonvolatile semiconductor memory. Application of the resistance change memory as a work memory of a system such as a small portable device desired to have low power consumption has been considered since the operating speed of the resistance change memory is higher than that of a NAND flash memory and the capacity of the resistance change memory can be increased three-dimensionally.

Since the resistance change memory is generally used as a rewritable memory, a resistance change film serving as a memory cell of the resistance change memory is required to be reversibly changeable from a low resistive state to a high resistive state and vice versa.

BRIEF DESCRIPTION OF THE DRAWINGS

FIG: 1 is a diagram showing an example of a semiconductor integrated circuit comprising a resistance change film.

FIG. 7 is a graph showing a voltage-current curve of the irreversible set.

FIG. 8 is a diagram showing an example of an irreversible reset.

FIG. 9 is a graph showing a voltage-current curve of the irreversible reset.

FIG. 10 is a diagram showing an example of application to a cross-point type resistance change memory.

FIG. 11 is a diagram showing an example of a memory cell comprising a resistance change film alone.

FIG. 12 is a diagram showing an example of a memory cell comprising a resistance change film and a diode.

FIG. 14 and FIG. 15 are illustrations showing examples of the memory cell.

FIG. 16 is a diagram showing a first example of a write operation.

FIG. 17 is a diagram showing a second example of the write operation.

FIG. 21 is a diagram showing a second example of orientations of two resistance change films.

FIG. 22A, FIG. 22B, and FIG. 22C are diagrams showing an example of a write operation.

FIG. 25 is a diagram showing an example of the redundancy circuit on a word line side.

FIG. 27 is a diagram showing an example of the redundancy circuit on a bit line side.

DETAILED DESCRIPTION

In general, according to one embodiment, a semiconductor integrated circuit comprises: a memory cell including first and second electrodes and a resistance change film therebetween, the resistance change film being reversibly changeable between first and second resistive states; and a control circuit controlling a potential difference between the first and second electrodes. The control circuit reversibly changes the memory cell to the first resistive state by applying a first potential to the first electrode and by applying a second potential smaller than the first potential to the second electrode. The control circuit reversibly changes the memory cell to the second resistive state by applying a third potential to the first electrode and by applying a fourth potential smaller than the third potential to the second electrode. The control circuit irreversibly fixes the memory cell to a third resistive state by applying a fifth potential to the first electrode and by applying a sixth potential greater than the fifth potential to the second electrode.

Embodiments will be described hereinafter with reference to the accompanying drawings.

1. First Embodiment

Figure 1:
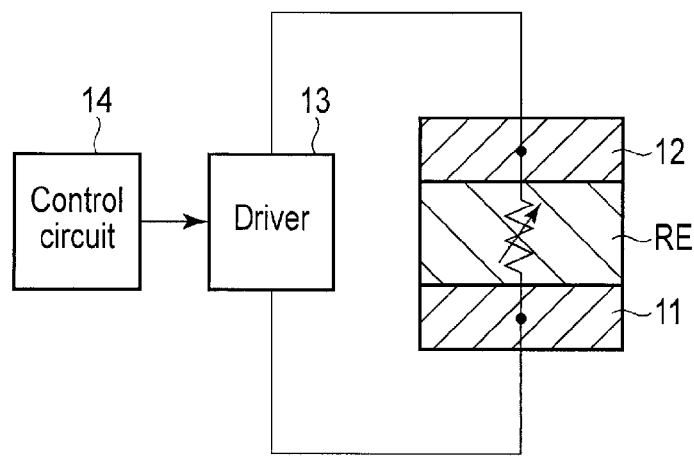

FIG. 1 shows a semiconductor integrated circuit of a first embodiment.

The semiconductor integrated circuit comprises a first electrode 11, a second electrode 12, a resistance change film RE which is connected between the first electrode 11 and the second electrode 12 and which can reversibly change from a first resistive state to a second resistive state and vice versa, a driver 13 which applies a potential difference between the first electrode 11 and the second electrode 12, and a control circuit 14 which controls the potential difference between the first electrode 11 and the second electrode 12.

In the present embodiment, a positional relationship in a vertical direction between the first electrode 11 and the second electrode 12 is not particularly limited. For example, the second electrode 12 may be located above the first electrode 11 or the first electrode 11 may be located above the second electrode 12.

In addition, each of the first electrode 11, the second electrode 12 and the resistance change film RE may be formed in a single-layer structure or a multilayer structure comprising layers.

Furthermore, a diode may be serially connected to a resistance change element comprising the first electrode 11, the second electrode 12 and the resistance change film RE.

The first electrode 11 and the second electrode 12 contain metals such as Ni, Pt, Au, Ag, Ru, Ir, Co, Ti, Al, Rh, Nb, and W, an impurity-doped conductive semiconductor such as polysilicon, or a silicide of these metals and the conductive semiconductor. In addition, the material of the first electrode 11 and the second electrode 12 may be, for example, Titanium-Aluminum-Nitride (ex. TiAlN), Strontium-Ruthenium-Oxide (ex. $SrRuO_3$), Ruthenium-Nitride (ex. RuN), Titanium-Nitride (ex. TiN), Tantalum-Nitride (ex. TaN), Lanthanum-Nickel-Oxide (ex. $LaNiO_x$), Plutinum-Iridium-Oxide (ex. $PtIrO_x$), Plutinum-Rhodium-Oxide (ex. $PtRhO_x$), Tantalum-Aluminum-Nitride (ex. TaAlN), and Indium-Tin-Oxide (ex. $InSnO_x$).

The resistance change film RE may contains one of more metal oxides such as Hafnium oxide (ex. $HfO_x$), Silicon oxide (ex. $SiO_x$), Tantalum oxide ($TaO_x$), Zinc oxide (ex. ZnO), Titanium oxide (ex. $TiO_2$), Nickel oxide (ex. NiO), and Tungsten oxide (ex. $WO_x$). The resistance change film RE can reversibly change in at least two resistive states. To simplify explanations, however, the resistance change film RE is hereinafter assumed to be reversibly changeable in two resistive states.

One of the two resistive states of the resistance change film RE is called a low resistive state (LRS) and the other state is called a high resistive state (HRS). In addition, the high resistive state is regarded as a reset state while the low resistive state is regarded as a set state. The resistance change film RE is in the reset state as an initialization state.

The control circuit 14 controls a potential difference applied between the first electrode 11 and the second electrode 12 via a driver 13 at the set/reset times (write/erase times).

Setting is an operation of changing from the high resistive state (reset state) to the low resistive state (set state) in the resistance change film RE. Resetting is an operation of changing from the low resistive state (set state) to the high resistive state (reset state) in the resistance change film RE. The set voltage is a potential difference required to set the resistance change film RE in the set state, and the reset voltage is a potential difference required to set the resistance change film RE in the reset state.

In the present embodiment, the set/reset voltages are assumed to have the same polarity. Set/reset operations using the set/reset voltages are called monopolar operations.

The control circuit 14 controls four operations explained below, at the set/reset times.

* Reversible Set ("0"-Write)

For example, when the low resistive state of the resistance change film RE is assumed to be in a "0" state, a reversible set indicates "0"-write. "Reversible" means that the resistance change film RE can be returned again to the reset state after executing the set operation.

Figure 2:
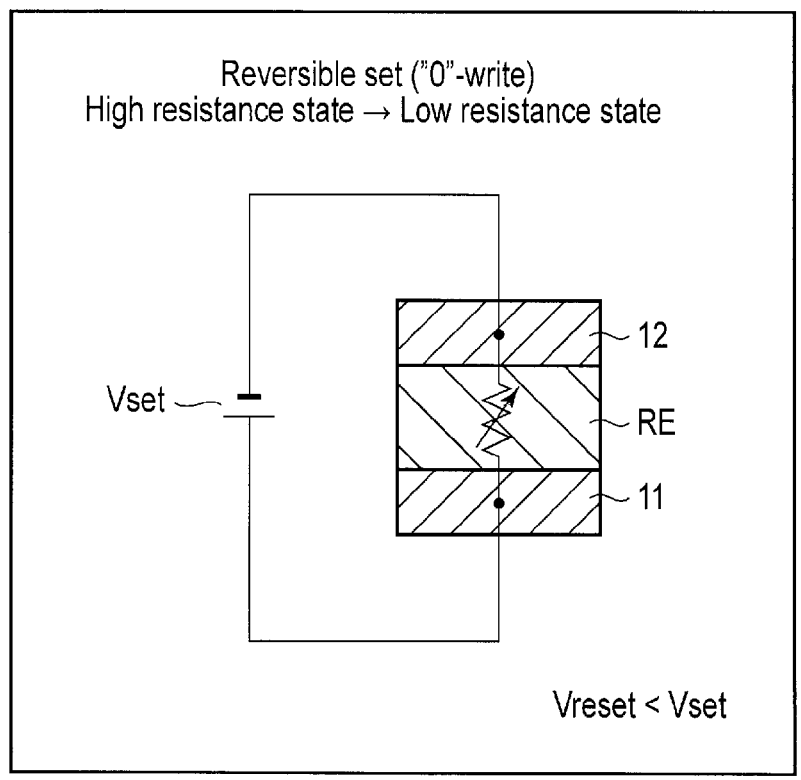
FIG. 2 is a diagram showing an example of a reversible set.
Figure 3:
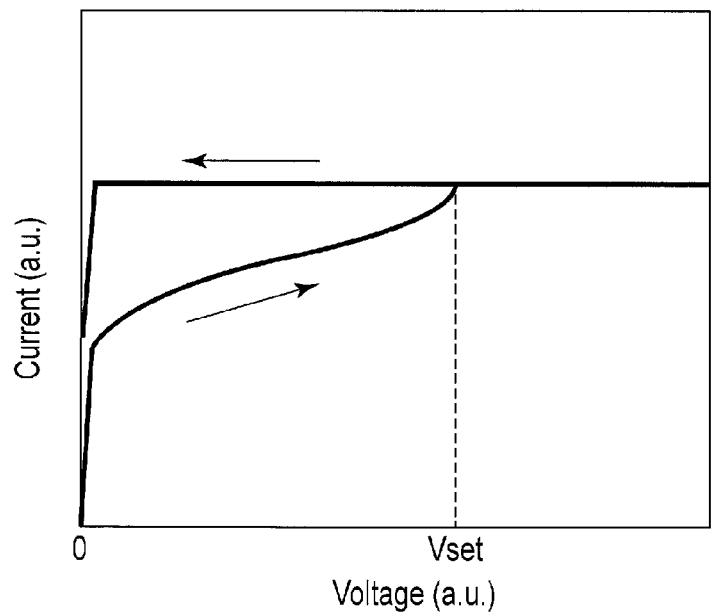
FIG. 3 is a graph showing a voltage-current curve of the reversible set.

FIG. 2 shows a state of the resistance change film RE in the reversible set. FIG. 3 shows a voltage-current curve in the reversible set.

In the reversible set, the control circuit 14 applies a potential V1 to the first electrode 11 and applies a potential V2 smaller than the potential V1 to the second electrode 12. A maximum value of a potential difference between two potentials V1 and V2 is Vset (=V1−V2).

The resistance change film RE is in the high resistive state HRS before the potential difference Vset is applied to the resistance change film RE. For this reason, a current flowing to the resistance change film RE is small when the potential difference is applied to the resistance change film RE. After that, however, if the potential difference Vset is applied to the resistance change film RE, the resistance change film RE is changed to be in the low resistive state LRS.

Thus, after the potential difference Vset is supplied to the resistance change film RE, the current flowing to the resistance change film RE becomes larger than that before the potential difference Vset is applied to the resistance change film RE.

* Reversible Reset ("1"-Write)

For example, when the high resistive state of the resistance change film RE is assumed to be in a "1" state, a reversible reset indicates "1"-write. "Reversible" means that the resistance change film RE can be returned again to the set state after executing the reset operation.

Figure 4:
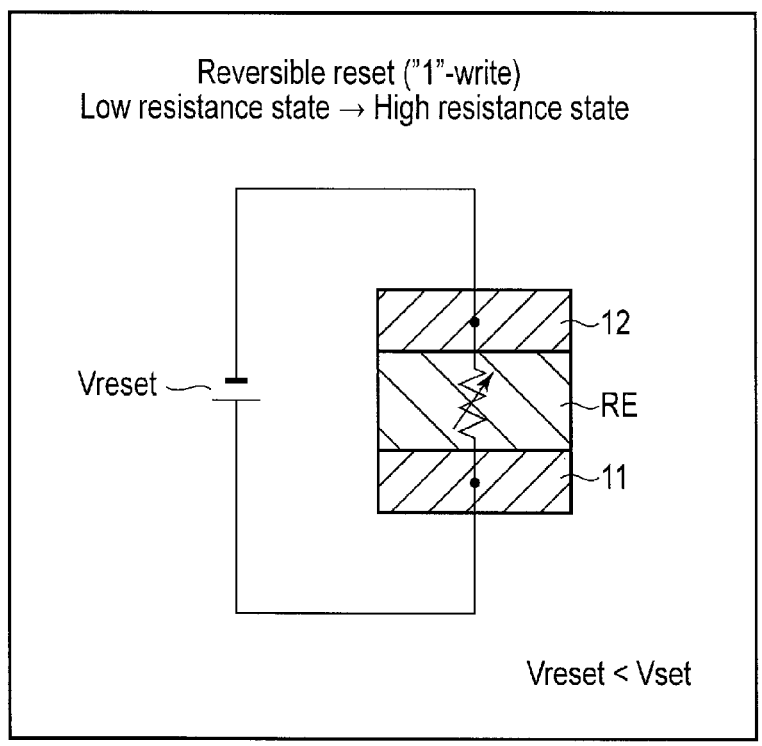
FIG. 4 is a diagram showing an example of a reversible reset.
Figure 5:
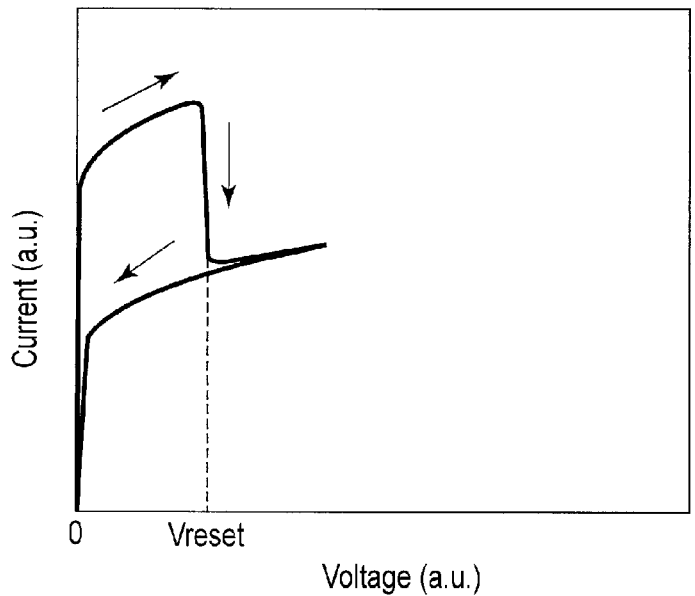
FIG. 5 is a graph showing a voltage-current curve of the reversible reset.

FIG. 4 shows a state of the resistance change film RE in the reversible reset. FIG. 5 shows a voltage-current curve in the reversible reset.

In the reversible set, the control circuit 14 applies the potential V1 to the first electrode 11 and applies the potential V2 smaller than the potential V1 to the second electrode 12. The maximum value of the potential difference between two potentials V1 and V2 is Vreset (=V1−V2). Vreset is, for example, smaller than Vset.

The resistance change film RE is in the low resistive state LRS before the potential difference Vreset is applied to the resistance change film RE. For this reason, a current flowing to the resistance change film RE is large when the potential difference is supplied to the resistance change film RE. After that, however, if the potential difference Vreset is applied to the resistance change film RE, the resistance change film RE is changed to be in the high resistive state HRS.

Thus, after the potential difference Vreset is applied to the resistance change film RE, the current flowing to the resistance change film RE becomes smaller than that before the potential difference Vreset is applied to the resistance change film RE.

* Irreversible Set ("0"-Fix)

For example, when the low resistive state of the resistance change film RE is assumed to be in a "0" state, an irreversible set indicates "0"-fix (one-time program). "Irreversible" means that the resistance change film RE cannot be returned again to the reset state after executing the set operation.

Figure 6:
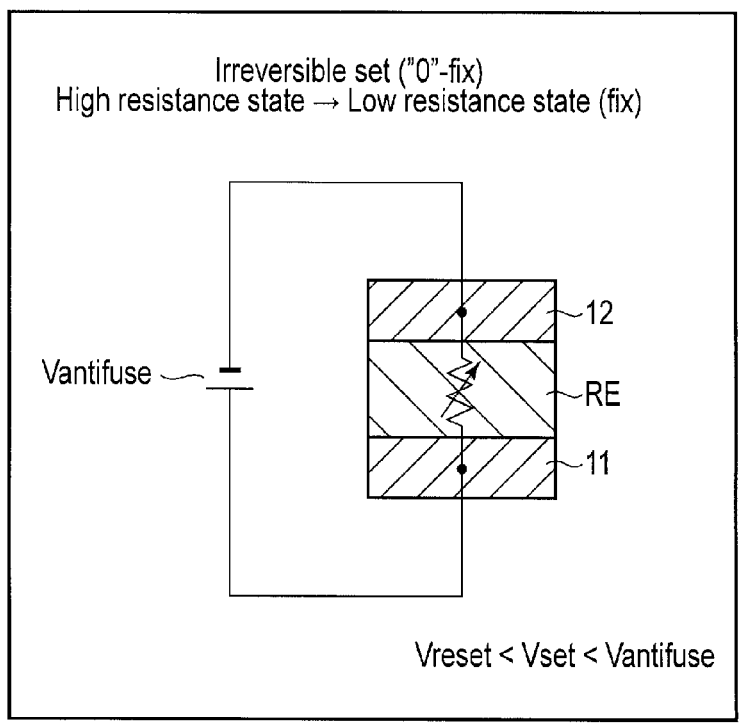
FIG. 6 is a diagram showing an example of an irreversible set.

FIG. 6 shows a state of the resistance change film RE in the irreversible set. FIG. 7 shows a voltage-current curve in the irreversible set.

In the irreversible set, the control circuit 14 applies the potential V1 to the first electrode 11 and applies the potential V2 smaller than the potential V1 to the second electrode 12. The maximum value of the potential difference between two potentials V1 and V2 is Vantifuse (=V1−V2). Vantifuse is, for example, greater than both of Vset and Vreset.

The resistance change film RE is in the high resistive state HRS or the low resistive state LRS before the potential difference Vantifuse is applied to the resistance change film RE. It will be explained here that the resistance change film RE is in the low resistive state LRS before the potential difference Vantifuse is supplied to the resistance change film RE.

In this case, a current flowing to the resistance change film RE is large when application of the potential difference to the resistance change film RE is started. After that, however, if the potential difference applied to the resistance change film RE is varied to Vreset, the resistance change film RE is changed to be in the high resistive state HRS. For this reason, the current flowing to the resistance change film RE becomes small.

After that, if the potential difference applied to the resistance change film RE is further varied to Vantifuse, the resistance change film RE is fixed in the low resistive state LRS. For this reason, after the potential difference Vantifuse is applied to the resistance change film RE, the current flowing to the resistance change film RE becomes larger than that before the potential difference Vantifuse is applied to the resistance change film RE.

* Irreversible Reset ("1"-Fix)

For example, when the high resistive state of the resistance change film RE is assumed to be in a "1" state, an irreversible reset is "1"-fix (one-time program). "Irreversible" means that the resistance change film RE cannot be returned again to the set state after executing the reset operation.

FIG. 8 shows a state of the resistance change film RE in the irreversible reset. FIG. 9 shows a voltage-current curve in the irreversible reset.

In the irreversible set, the control circuit 14 applies the potential V1 to the first electrode 11 and applies the potential V2 greater than the potential V1 to the second electrode 12. The maximum value of the potential difference between two potentials V1 and V2 is Vfuse (=V2−V1). A polarity of Vfuse is different from polarities of Vset, Vreset and Vantifuse.

In addition, an absolute value |Vfuse| of Vfuse is greater than either of an absolute value |Vset| of Vset and an absolute value |Vreset| of Vreset.

The resistance change film RE is in the high resistive state HRS or the low resistive state LRS before the potential difference Vfuse is applied to the resistance change film RE. It will be explained here that the resistance change film RE is in the low resistive state LRS before the potential difference Vfuse is applied to the resistance change film RE.

In this case, a current flowing to the resistance change film RE is large when supply of the potential difference to the resistance change film RE is started. After that, however, if the potential difference supplied to the resistance change film RE is varied to Vfuse, the resistance change film RE is changed to be in the high resistive state HRS. For this reason, after the potential difference Vfuse is supplied to the resistance change film RE, the current flowing to the resistance change film RE becomes smaller than that before the potential difference Vfuse is supplied to the resistance change film RE.

Incidentally, when the resistance change film RE is formed of hafnium oxide, it is desirable that the first electrode 11 should be formed of nickel and the second electrode 12 should be formed of titanium nitride, at the time of executing the above-explained four operations. In addition, when the resistance change film RE is formed of silicon oxide, it is desirable that the first electrode 11 should be formed of titanium nitride and the second electrode 12 should be formed of titanium.

2. Second Embodiment

FIG. 10 shows a semiconductor integrated circuit of a second embodiment.

The semiconductor integrated circuit relates to what is called a cross-point type resistance change memory, for example, ReRAM.

The semiconductor integrated circuit comprises word lines WL0 to WL3 extending in a first direction, bit lines BL0 to BL3 extending in a second direction which intersects the first direction, memory cells MC connected between the word lines WL0 to WL3 and the bit lines BL0 to BL3, respectively, a first driver 13A driving the word lines WL0 to WL3, and a second driver 13B driving the bit lines BL0 to BL3.

Each of the memory cells MC in the memory cell array 20 comprises at least the first electrode 11, the resistance change film RE and the second electrode 12 explained above in the first embodiment (FIG. 1). However, the first electrode 11 may be either of the word line WLi and the bit line BLj, and the second electrode 12 may be the other of the word line WLi and the bit line BLj. Each of i and j is 0, 1, 2, 3, . . . .

When the resistive state of each of the memory cells MC in the memory cell array 20 is changed, the control circuit 14 controls the potential difference between the first electrode 11 and the second electrode 12 (FIG. 1) in each of the memory cells MC, by means of the first driver 13A and the second driver 13B.

The resistive state of each of the memory cells MC in the memory cell array 20 can be thereby changed to the state of any one of four operations (reversible set, reversible reset, irreversible set and irreversible reset) explained above in the first embodiment.

FIG. 11 and FIG. 12 show examples of the memory cells MC shown in FIG. 10.

In the example shown in FIG. 11, each of the memory cells MC comprises a resistance change element alone. In this example, all of four operations (reversible set, reversible reset, irreversible set and irreversible reset) explained above in the first embodiment can be executed as explained later.

In the example shown in FIG. 12, each of the memory cells MC comprises a resistance change element and a diode which are connected serially. In this example, three operations (reversible set, reversible reset, and irreversible set) that can be executed with the potential difference of the same polarity, of the four operations (reversible set, reversible reset, irreversible set and irreversible reset) explained above in the first embodiment, can be executed as explained later.

Figure 13:
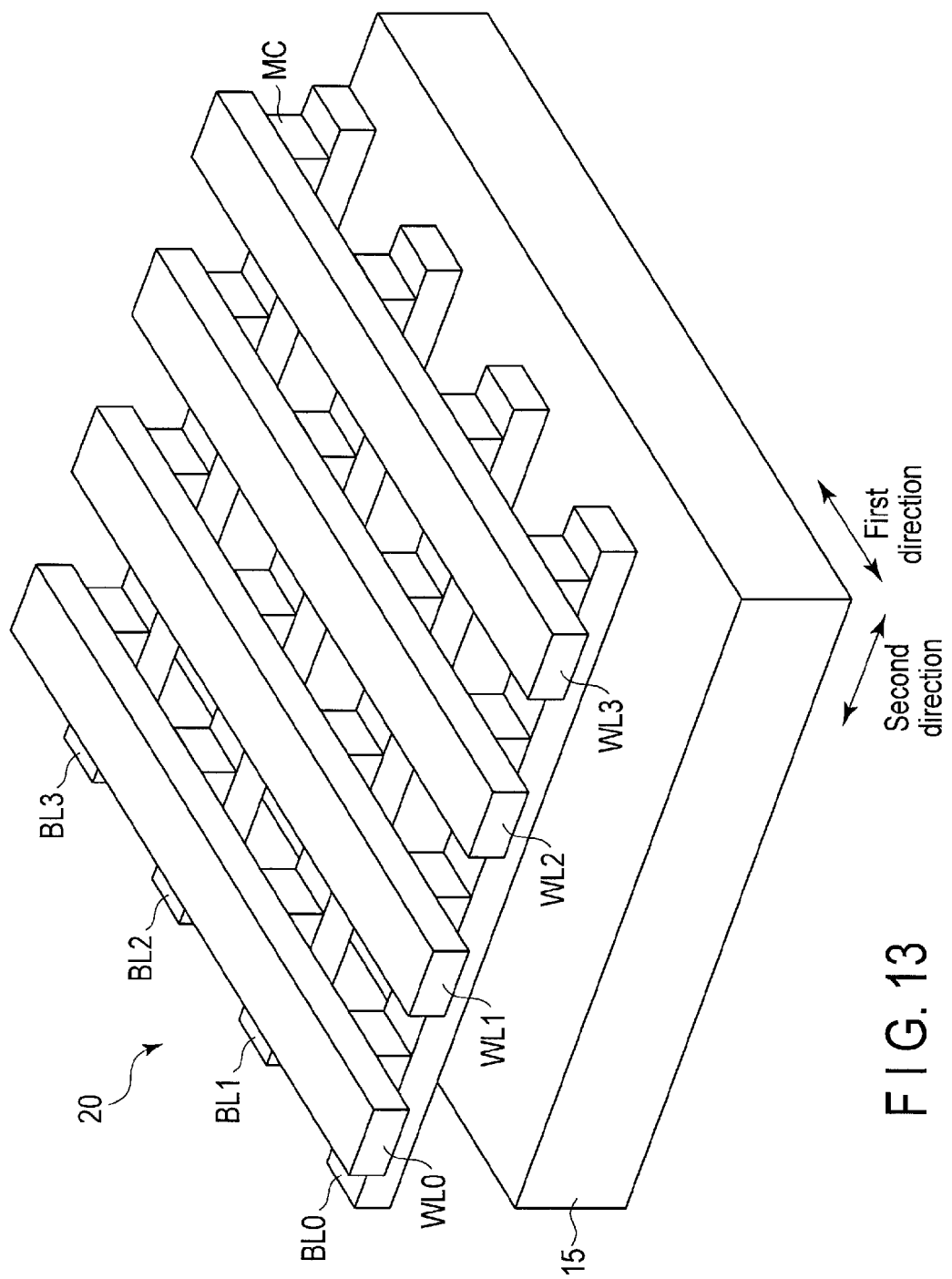
FIG. 13 is an illustration showing an example of a device structure of a memory cell array.

FIG. 13 shows an example of a device structure of the memory cell array 20 shown in FIG. 10.

The word lines WL0 to WL3 have a line and space pattern, and are extended in the first direction which is parallel to an upper surface of a semiconductor substrate 15. The bit lines BL0 to BL3 have a line and space pattern, and are extended in the second direction which is parallel to the upper surface of the semiconductor substrate 15. The first direction and the second direction intersect each other.

The word lines WL0 to WL3 are disposed on the bit lines BL0 to BL3 in this example, but the bit lines BL0 to BL3 may be disposed on the word lines WL0 to WL3 instead.

FIG. 14 and FIG. 15 show examples of the memory cells MC shown in FIG. 13.

The example shown in FIG. 14 corresponds to the example shown in FIG. 11.

In other words, each of the memory cells MC comprises a resistance change film RE alone.

In this example, the bit line BLj (j=0, 1, 2, 3, . . . ) may be one of the first electrode 11 and the second electrode 12 shown in FIG. 1, and the word line WLi (i=0, 1, 2, 3, . . . ) may be the other of the first electrode 11 and the second electrode 12 shown in FIG. 1, as shown in FIG. 14(a).

Alternatively, one of the first electrode 11 and the second electrode 12 shown in FIG. 1 may be disposed between the resistance change film RE and the bit line BLj (j=0, 1, 2, 3, . . . ), and the other of the first electrode 11 and the second electrode 12 shown in FIG. 1 may be disposed between the resistance change film RE and the word line WLi (i=0, 1, 2, 3, . . . ), as shown in FIG. 14(b).

The example shown in FIG. 15 corresponds to the example shown in FIG. 12.

In other words, each of the memory cells MC comprises a resistance change memory and a diode. The resistance change memory is disposed on the diode in this example, but the diode may be disposed on the resistance change memory instead.

The diode can adopt layers of P-type silicon and N-type silicon, layers of a metal having a great work function and N-type silicon, layers of a metal having a small work function and P-type silicon, a structure in which the insulator is sandwiched between two metals, etc.

In this example, the diode is composed of an insulating film D and two electrodes E1 and E2 that sandwich the insulating film D. The electrode E1 is disposed on the side of the bit line BLj (j=0, 1, 2, 3, . . . ). In addition, one of the first electrode 11 and the second electrode 12 shown in FIG. 1 is disposed between n the resistance change film RE and the electrode E2 while the other of the first electrode 11 and the second electrode 12 shown in FIG. 1 is disposed between the resistance change film RE and the word line WLi (i=0, 1, 2, 3, . . . ). However, this configuration is one of configuration examples.

FIG. 16 shows an example of set/reset operations at the time of using the memory cell array shown in FIG. 11.

The set/reset operations indicate four operations, i.e., the reversible set/reset operations and the irreversible set/reset operations.

When a selected memory cell MC-sel is connected between a word line WL2 and a bit line BL2, the control circuit 14 sets the word line WL2 at Vsel and sets the other word lines WL0, WL1, and WL3 at Vsel/2 by the first driver 13A. In addition, the control circuit 14 sets the bit line BL2 at 0V (ground potential) and sets the other bit lines BL0, BL1, and BL3 at Vsel/2 by the second driver 13B.

At this time, a potential difference Vsel is applied to the selected memory cell MC-sel. A resistive state of the selected memory cell MC-sel is changed to the set state (low resistive state LRS) or the reset state (high resistive state HRS).

In addition, the potential difference Vsel/2 is applied to unselected memory cells connected to the word line WL2 or the bit line BL2, of unselected memory cells other than the selected memory cell MC-sel. Resistive states of the unselected memory cells are not therefore changed. However, Vsel/2 needs to be smaller than the set voltage Vset and the reset voltage Vreset.

In addition, a potential difference is not applied to unselected memory cells connected between the word lines WL0, WL1 and WL3 and the bit lines BL0, BL1 and BL3, of the unselected memory cells other than the selected memory cell MC-sel. Resistive states of the unselected memory cells are not therefore changed either.

Vsel is varied depending on executing the set/reset operations reversibly or irreversibly. Vsel is set at Vset or Vreset when the set/reset operations are reversibly executed. In addition, Vsel is set at Vantifuse or Vfuse when the set/reset operations are irreversibly executed.

In this example, Vset, Vreset and Vantifuse are potentials having the same polarity (for example, positive potentials) while Vfuse is opposite in polarity to Vantifuse (for example, a negative potential).

However, if Vfuse does not need to be generated as the negative potential, a relationship in potential shown in FIG. 17 can also be made.

In the example shown in FIG. 17, the bit line BL2 is set at Vsel (=Vfuse) while the word line WL2 is set at 0V (ground potential). The other elements are the same as those of the example shown in FIG. 16. In this case, even if Vfuse is set at the positive potential, the potential difference of the polarity opposite to that in the reversible set/reset operations and the irreversible set operation can be applied to the selected memory cell MC-sel.

Figure 18:
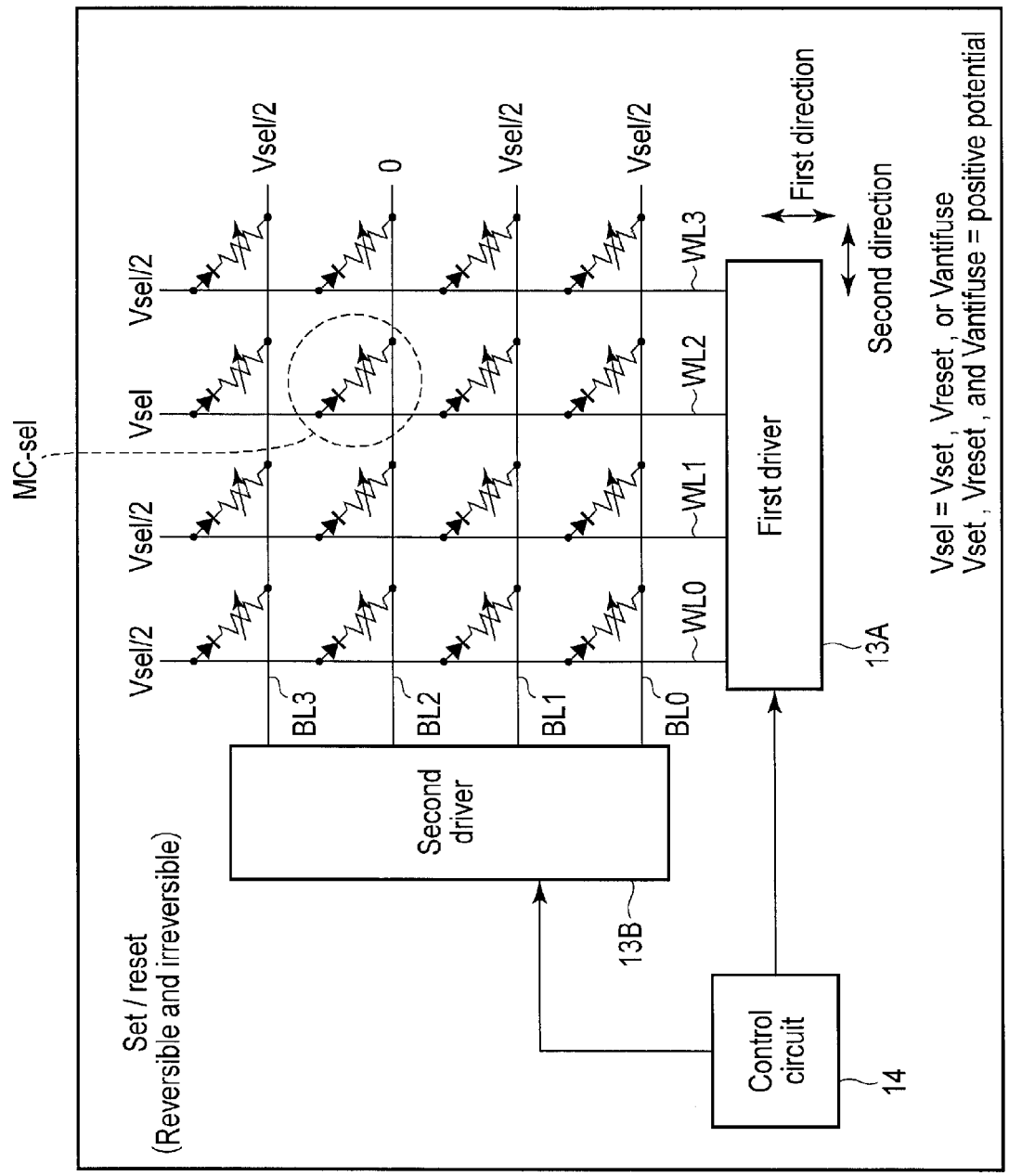
FIG. 18 is a diagram showing a third example of the write operation.

FIG. 18 shows an example of set/reset operations at the time of using the memory cell array shown in FIG. 12.

The set/reset operations indicate three operations, i.e., the reversible set/reset operations and the irreversible set operation.

When a selected memory cell MC-sel is connected between a word line WL2 and a bit line BL2, the control circuit 14 sets the word line WL2 at Vsel and sets the other word lines WL0, WL1, and WL3 at Vsel/2 by the first driver 13A. In addition, the control circuit 14 sets the bit line BL2 at 0V (ground potential) and sets the other bit lines BL0, BL1, and BL3 at Vsel/2 by the second driver 13B.

At this time, a potential difference Vsel is applied to the selected memory cell MC-sel. A resistive state of the selected memory cell MC-sel is changed to the set state (low resistive state LRS) or the reset state (high resistive state HRS).

In addition, the potential difference Vsel/2 is applied to unselected memory cells connected to the word line WL2 or the bit line BL2, of unselected memory cells other than the selected memory cell MC-sel. Resistive states of the unselected memory cells are not therefore changed. However, Vsel/2 needs to be smaller than the set voltage Vset and the reset voltage Vreset.

In addition, a potential difference is not applied to unselected memory cells connected between the word lines WL0, WL1 and WL3 and the bit lines BL0, BL1 and BL3, of the unselected memory cells other than the selected memory cell MC-sel. Resistive states of the unselected memory cells are not therefore changed either.

Vsel is varied depending on executing the set/reset operations reversibly or irreversibly. Vsel is set at Vset or Vreset when the set/reset operations are reversibly executed. In addition, Vsel is set at Vantifuse when the set operation is irreversibly executed.

In this example, the reset operation cannot be executed irreversibly.

This is because, to execute the reset operation irreversibly, the potential difference of the polarity opposite to that in the reversible set/reset operations and the irreversible set operation needs to be applied to the selected memory cell MC-sel. In this example, however, a memory cell diode is added in order to prevent what is called a sneak current peculiar to the cross-point type resistance change memory. In other words, the direction of the current flowing to the selected memory cell MC-sel is limited to one way.

In this example, the reset operation cannot be therefore executed irreversibly.

3. Third Embodiment

Figure 19:
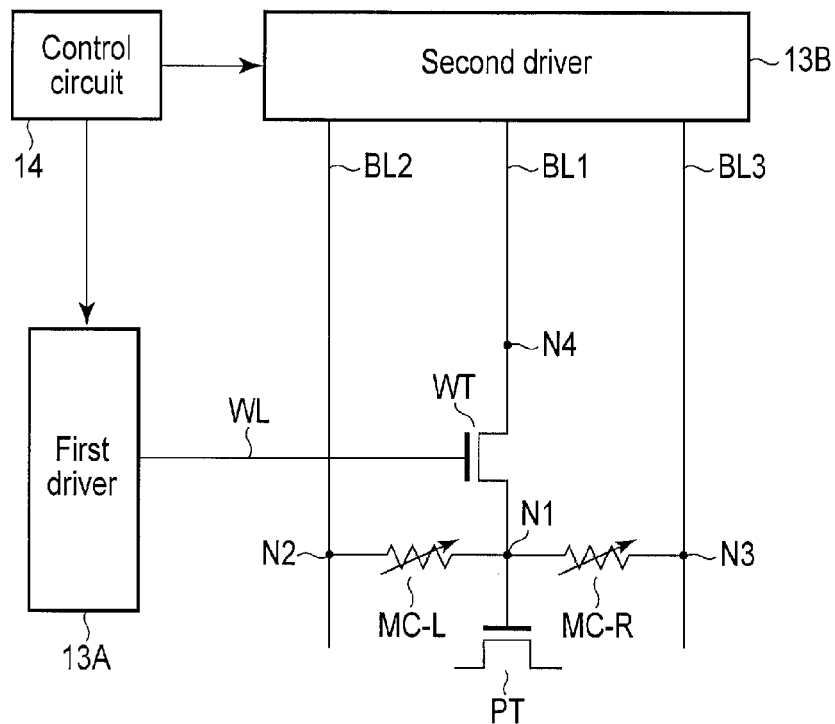
FIG. 19 is a diagram showing an example of application to a programmable switch.

FIG. 19 shows a semiconductor integrated circuit of a third embodiment.

The semiconductor integrated circuit relates to a programmable switch.

The programmable switch is used in, for example, a reconfigurable logic circuit represented by a field programmable gate array (FPGA). In addition, the programmable switch determines power-on/power-off of a pass transistor, based on data stored in, for example, a configuration memory.

The semiconductor integrated circuit comprises a first node N1, a second node N2, a third node N3, a fourth node N4, a first memory cell MC-L connected between the first node N1 and the second node N2, a second memory cell MC-R connected between the first node N1 and the third node N3, a first switching element WT comprising a first control terminal (gate) and switching connection/disconnection between the first node N1 and the fourth node N4, a second switching element PT comprising a second control terminal (gate) connected to the first node N1, a first driver 13A connected to the first control terminal, and a second driver 13B connected to the second node N2, the third node N3, and the fourth node N4. The fourth node N4 may be connected not to the second driver 13B, but to the first driver 13A.

Each of the first memory cell MC-L and the second memory cell MC-R serving as configuration memories comprises a first electrode 11, a resistance change film RE and a second electrode 12 explained in the first embodiment (FIG. 1). Orientation of the first memory cell MC-L and the second memory cell MC-R is not particularly limited, but it is desirable that the first memory cell MC-L and the second memory cell MC-R should be disposed symmetrically with each other in consideration of simply executing set/reset operations to be explained later.

Figure 20:
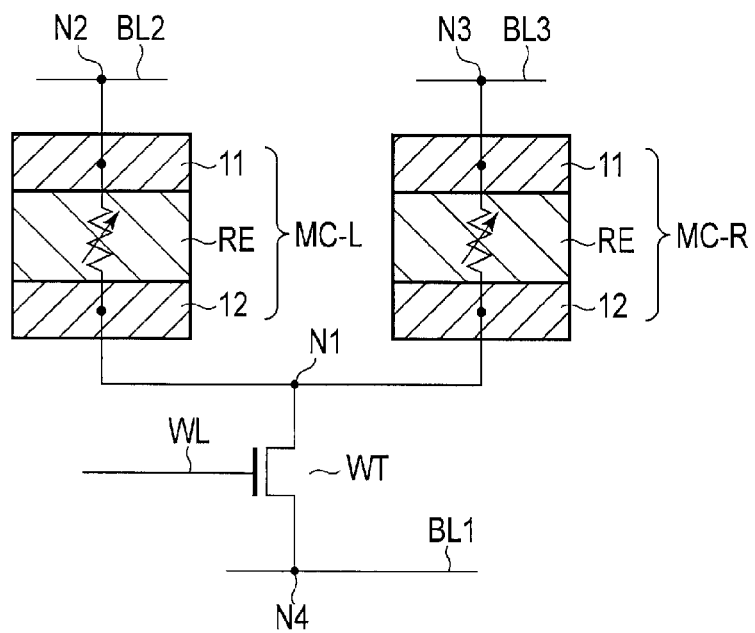
FIG. 20 is a diagram showing a first example of orientations of two resistance change films.

It is desirable that both of a first electrode 11 in the first memory cell MC-L and a first electrode 11 in the second memory cell MC-R should be connected to the first node N1, that a second electrode 12 in the first memory cell MC-L should be connected to the second node N2, and that a second electrode 12 in the second memory cell MC-R should be connected to the third node N3, as shown in, for example, FIG. 20.

In addition, it is desirable that both of the second electrode 12 in the first memory cell MC-L and the second electrode 12 in the second memory cell MC-R should be connected to the first node N1, that the first electrode 11 in the first memory cell MC-L should be connected to the second node N2, and that the first electrode 11 in the second memory cell MC-R should be connected to the third node N3, as shown in, for example, FIG. 21.

The first switching element WT is, for example, an N-channel FET and functions as a write transistor. The first control terminal (gate) of the first switching element WT is connected to the first driver 13A via a word line WL. The second switching element PT is, for example, an N-channel FET and functions as a pass transistor having power-on/power-off determined based on the configuration data.

The configuration data is stored in the first memory cell MC-L and the second memory cell MC-R by changing a resistive state of each of the first memory cell MC-L and the second memory cell MC-R to the state of any one of four operations (reversible set, reversible reset, irreversible set and irreversible reset) explained above in the first embodiment.

In the configuration memory, complementary data is stored as configuration data in the first memory cell MC-L and the second memory cell MC-R. In other words, the resistance change film RE in the first memory cell MC-L is in a resistive state different from a resistive state of the resistance change film RE in the second memory cell MC-R.

FIG. 22A shows an example of set/reset operations of the programmable switch shown in FIG. 19 to FIG. 21.

The set/reset operations indicate four operations, i.e., the reversible set/reset operations and the irreversible set/reset operations.

When, for example, "0" is stored in the configuration memory, the resistance change film RE in the first memory cell RE-L is set to be in the set state (low resistive state) and the resistance change film RE in the second memory cell RE-R is set to be in the reset state (high resistive state), by the reversible set/reset operations or the irreversible set/reset operations.

The set/reset operations for the first memory cell MC-L and the second memory cell MC-R can be executed reversibly or irreversibly.

The set/reset operations for the first memory cell MC-L and the second memory cell MC-R can be executed simultaneously or separately. In the latter case, for example, the set/reset operations for the first memory cell MC-L are first executed as shown in FIG. 22B. After that, the set/reset operations for the second memory cell MC-R are executed as shown in FIG. 22C.

It is desirable that when the resistive state of the resistance change film RE in the first memory cell MC-L is fixed irreversibly, the resistive state of the resistance change film RE in the second memory cell MC-R should also be fixed irreversibly.

For example, when "0" is stored in the configuration memory, the control circuit 14 controls the potential difference between the first electrode 11 and the second electrode 12 in each of the first memory cell MC-L and the second memory cell MC-R via the first driver 13A and the second driver 13B.

For example, the word line WL is set at Von. Von is a potential at which the first switching element WT realized by a write transistor is turned on.

In addition, a bit line BL1 is set at 0V (ground potential), a bit line BL2 is set at Vsel (=Vset or Vantifuse), and a bit line BL3 is set at Vsel (=Vreset or Vfuse).

At this time, the potential difference Vsel (=Vset or Vantifuse) is applied to the resistance change film RE in the first memory cell MC-L. The resistive state of the resistance change film RE in the first memory cell MC-L is changed to the set state (low resistive state).

In addition, the potential difference Vsel (=Vreset or Vfuse) is applied to the resistance change film RE in the second memory cell MC-R. The resistive state of the resistance change film RE in the second memory cell MC-L is changed to the reset state (high resistive state).

In contrast, when, for example, "1" is stored in the configuration memory, the resistance change film RE in the first memory cell RE-L is set to be in the reset state (high resistive state) and the resistance change film RE in the second memory cell RE-R is set to be in the set state (low resistive state), by executing the reversible set/reset operations or the irreversible set/reset operations, similarly to the case of storing "0" in the configuration memory.

For example, the word line WL is set at Von, the bit line BL1 is set at 0V (ground potential), the bit line BL2 is set at Vsel (=Vreset or Vfuse), and the bit line BL3 is set at Vsel (=Vset or Vantifuse).

At this time, the potential difference Vsel (=Vreset or Vfuse) is applied to the resistance change film RE in the first memory cell MC-L. The resistive state of the resistance change film RE in the second memory cell MC-L is changed to the reset state (high resistive state).

In addition, the potential difference Vsel (=Vset or Vantifuse) is applied to the resistance change film RE in the second memory cell MC-R. The resistive state of the resistance change film RE in the second memory cell MC-L is changed to the set state (low resistive state).

In this example, Vset, Vreset and Vantifuse are the potentials having the same polarity (for example, positive potentials) while Vfuse is opposite in polarity to Vantifuse (for example, a negative potential).

In the set/reset operations, 0V (ground potential) is applied to the node N1, i.e., the second control terminal (gate) of the second switching element PT realized by a pass transistor. This has an effect of preventing a high voltage from being applied to the second switching element PT at the time of writing the configuration data. In other words, destruction of the second switching element PT can be prevented, a highly reliable programmable switch can be implemented.

Figure 23:
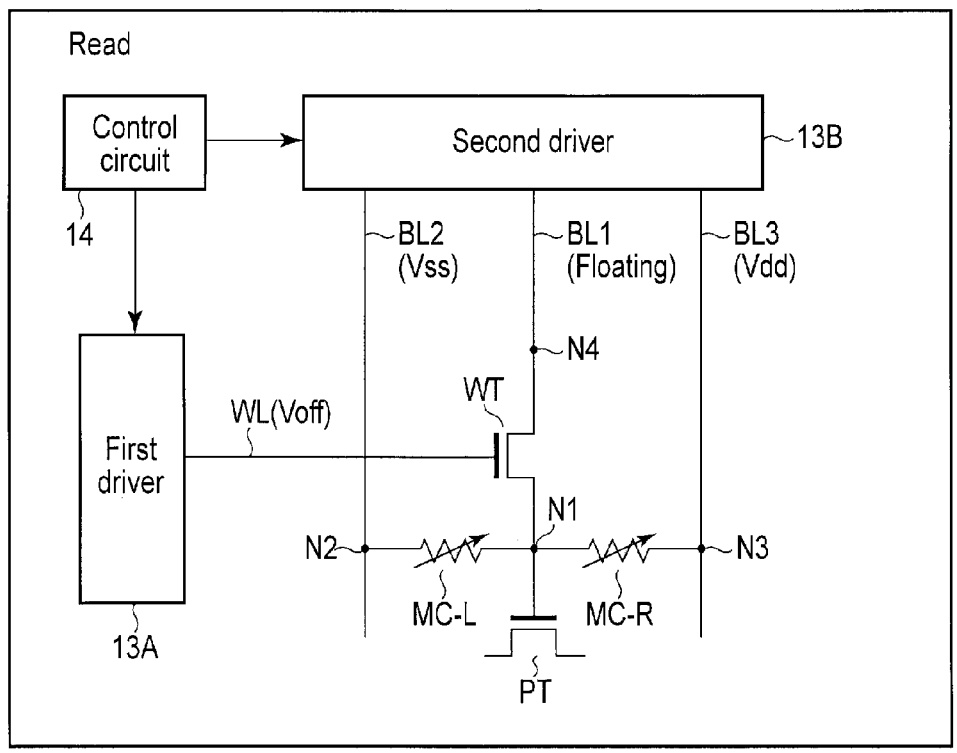
FIG. 23 is a diagram showing an example of a read operation.

FIG. 23 shows an example of a data read operation of the programmable switch shown in FIG. 19 to FIG. 21.

The data read operation involves reading the data stored in the first memory cell MC-L and the second memory cell MC-R serving as the configuration memories and powering on/off the second switching element PT based on the data.

At the time of reading the configuration data, the control circuit 14 sets, for example, the word line WL at Voff via the first driver 13A and the second driver 13B. Voff is a potential at which the first switching element WT realized by a write transistor is turned off. In addition, the control circuit 14 sets the bit line BL1 to be in the floating state, sets the bit line BL2 at the low potential (for example, ground potential) Vss and sets the bit line BL3 at the high potential (for example, power supply potential) Vdd.

For example, when "0" is stored in the configuration memory, the resistive state of the resistance change film RE in the first memory cell MC-L is the set state (low resistive state), and the resistive state of the resistance change film RE in the second memory cell MC-R is the reset state (high resistive state).

Therefore, the potential of the bit line BL2, i.e., the low potential Vss is read at the node N1, i.e., the second control terminal (gate) of the second switching element PT realized by a pass transistor. This operation is the "0"-read. At this time, the second switching element (N-channel FET) PT becomes in the OFF state.

In contrast, for example, when "1" is stored in the configuration memory, the resistive state of the resistance change film RE in the first memory cell MC-L is the reset state (high resistive state), and the resistive state of the resistance change film RE in the second memory cell MC-R is the set state (low resistive state).

Therefore, the potential of the bit line BL3, i.e., the high potential Vdd is read at the node N1, i.e., the second control terminal (gate) of the second switching element PT realized by a pass transistor. This operation is the "1"-read. At this time, the second switching element (N-channel FET) PT becomes in the ON state.

4. Fourth Embodiment

Figure 24:
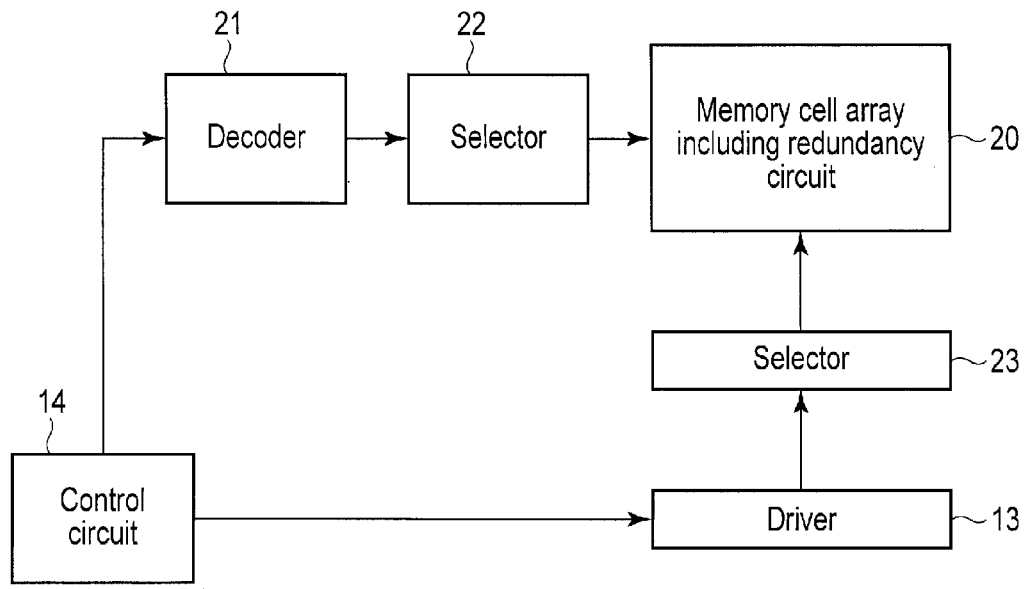
FIG. 24 is a diagram showing an example of application to a redundancy circuit.

FIG. 24 shows a semiconductor integrated circuit of a fourth embodiment.

The semiconductor integrated circuit relates to a resistance change memory, for example, a redundancy circuit of ReRAM.

The resistance change memory has a problem that a defective bit can easily occur in accordance with larger capacity, similarly to the other storage memories. A redundancy circuit is known as means for solving this problem. The defective bit is replaced with a good bit by unit of, for example, row or column. For this reason, the defective row or defective column is stored in the ROM (fuse or antifuse) as defective address data.

The present embodiment is characterized by using an irreversibly settable/resettable resistance change film as ROM.

The semiconductor integrated circuit comprises a memory cell array 20 including a memory cell and a redundancy cell for displacing the memory cell when the memory cell is defectively, a decoder 21 which decodes address data, a selector 22 which selects the memory cell based on decoded address data, a selector (select circuit) 23 which selects the redundancy cell, and a driver 13 which applies a potential to the redundancy cell.

The redundancy cell comprises at least the first electrode 11, the resistance change film RE and the second electrode 12 explained above in the first embodiment (FIG. 1).

When the memory cell is defectively, the control circuit 14 controls a potential difference between the first and second electrodes in the redundancy cell via the driver 13.

The resistive state of the redundancy cell can be thereby changed to the state of any one of four operations (reversible set, reversible reset, irreversible set and irreversible reset) explained above in the first embodiment.

FIG. 25 shows a circuit example for disconnection of a defective row.

The semiconductor integrated circuit is constituted by applying the semiconductor integrated circuit shown in FIG. 11 to the memory cell array 20 and the main decoder 21 shown in FIG. 24.

Elements in this drawing like or similar to those shown in FIG. 11 and FIG. 24 are denoted by the same reference numbers and symbols, and detailed explanations are omitted.

In the circuit example, redundancy cells 50 connected between word lines WL0 to WL3 and a first driver 21 (13A), and a third driver 13C connected to connection points between the word lines WL0 to WL3 and the redundancy cells 50 are further added to the semiconductor integrated circuit shown in FIG. 11.

Each of the redundancy cells 50 comprises at least the first electrode 11, the resistance change film RE and the second electrode 12 explained above in the first embodiment (FIG. 1).

When the resistive state of each of the redundancy cells 50 is changed, the control circuit 14 controls the potential difference between the first electrode 11 and the second electrode 12 (FIG. 1) in each of the redundancy cells 50, via the first driver 21 (13A) and the third driver 13C.

Figure 26:
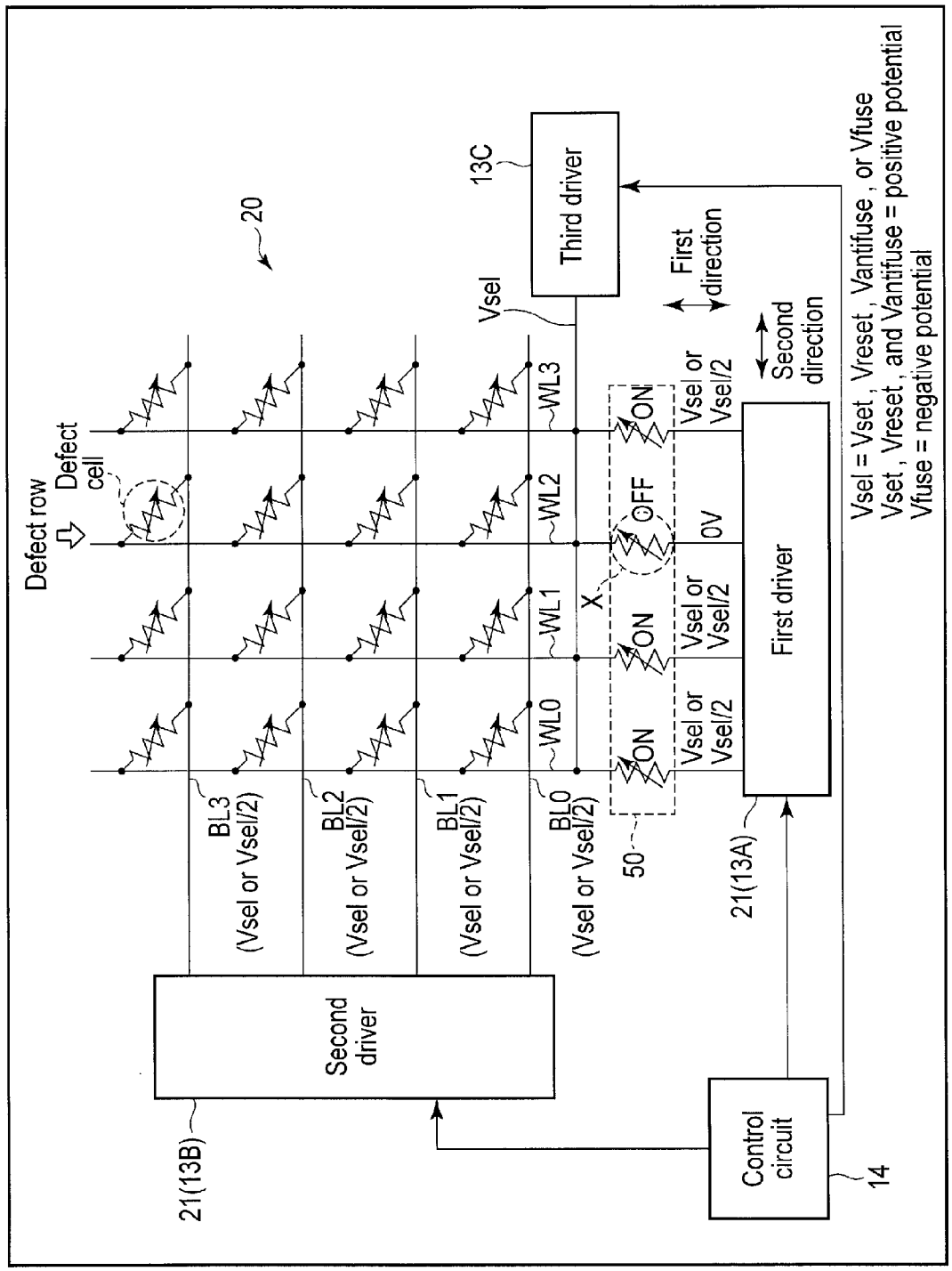
FIG. 26 is a diagram showing an example of a write operation.

When a defective cell is connected to the word line WL2 and a row corresponding to the word line WL2 is considered as a defective row, the control circuit 14 sets ends of the redundancy cells 50 on the sides of the word lines WL0 to WL3 at Vsel by the third driver 13C, as shown in, for example, FIG. 26.

In addition, the control circuit 14 sets ends of the redundancy cells 50 connected to the word lines WL0, WL1, and WL3 on the side of the first driver 21 (13A) at Vsel or Vsel/2 by the first driver 21 (13A). To prevent destruction of the resistance change film RE, the control circuit 14 also sets the bit lines BL0 to BL3 at Vsel or Vsel/2 by the second driver 21 (13B).

Furthermore, the control circuit 14 sets an end of the selector cell 50 (represented by X) connected to the word line WL2 on the side of the first driver 21 (13A) at 0V (ground potential) by the first driver 21 (13A).

At this time, for example, the selector cell 50 (represented by X) alone connected to the word line WL2 is reset irreversibly and fixed in the reset state (high resistive state), i.e., the OFF state. The redundancy cells 50 connected to the other word lines WL0, WL1, and WL3 are maintained in the initial state, for example, the set state (low resistive state), i.e., the ON state.

It should be noted that the redundancy cells 50 connected to the word lines WL0, WL1, and WL3 may be fixed in the set state (low resistive state), i.e., the ON state by the irreversible set.

FIG. 27 shows a circuit example for disconnection of a defective column.

The semiconductor integrated circuit is also constituted by applying the semiconductor integrated circuit shown in FIG. 11 to the memory cell array 20 and the main decoder 21 shown in FIG. 24.

Elements in this drawing like or similar to those shown in FIG. 11 and FIG. 24 are denoted by the same reference numbers and symbols, and detailed explanations are omitted.

In the circuit example, the redundancy cells 50 connected between the bit lines BL0 to BL3 and a second driver 21 (13B), and a third driver 13C connected to connection points between the bit lines BL0 to BL3 and the redundancy cells 50 are further added to the semiconductor integrated circuit shown in FIG. 11.

Each of the redundancy cells 50 comprises at least the first electrode 11, the resistance change film RE and the second electrode 12 explained above in the first embodiment (FIG. 1).

When the resistive state of each of the redundancy cells 50 is changed, the control circuit 14 controls the potential difference between the first electrode 11 and the second electrode 12 (FIG. 1) in each of the redundancy cells 50, via the second driver 21(13B) and the third driver 13C.

Figure 28:
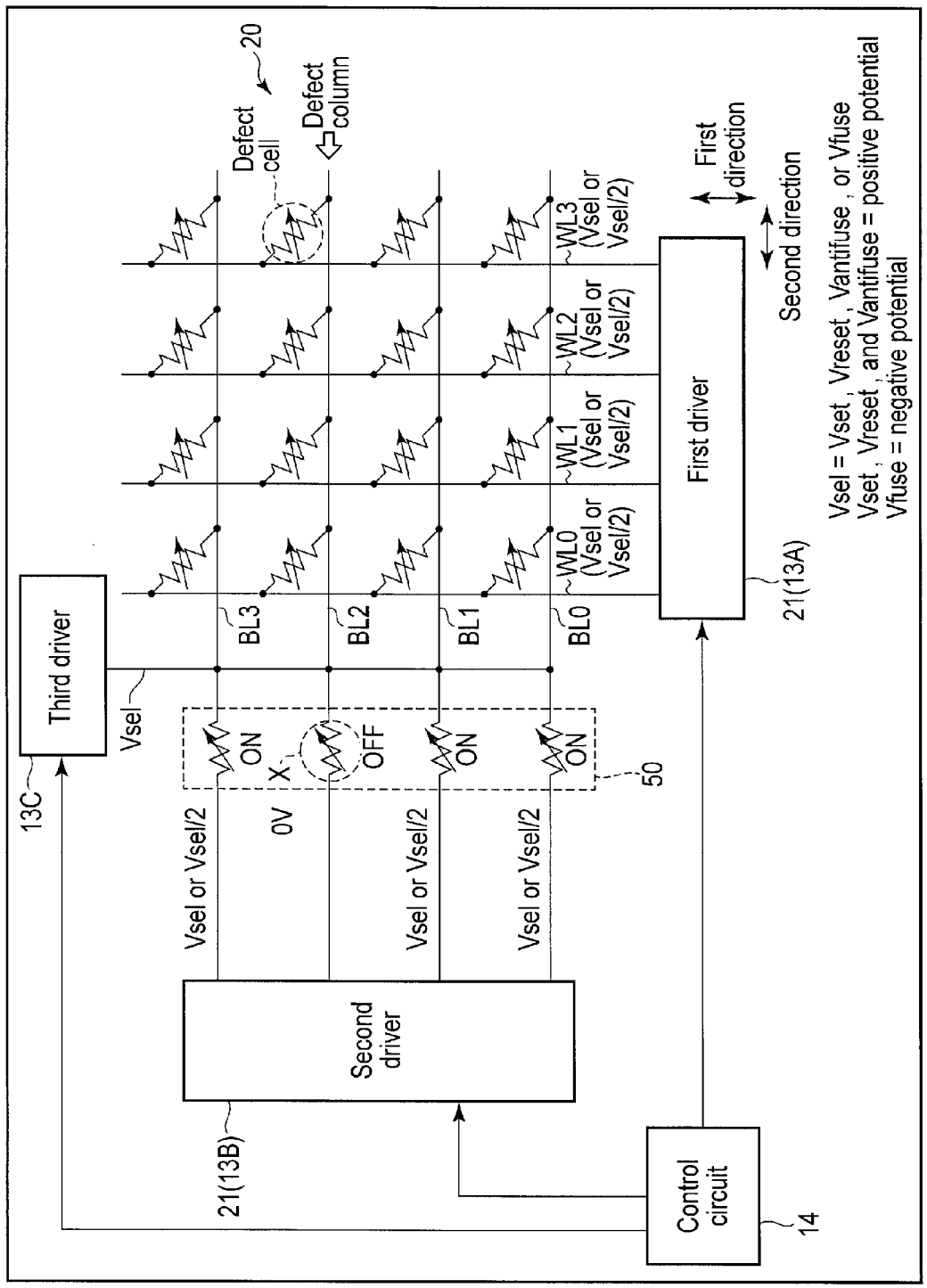
FIG. 28 is a diagram showing an example of a write operation.

When a defective cell is connected to the bit line BL2 and a column corresponding to the bit line BL2 is considered as a defective column, the control circuit 14 sets ends of the redundancy cells 50 on the sides of the bit lines BL0 to BL3 at Vsel by the third driver 13C, as shown in, for example, FIG. 28.

In addition, the control circuit 14 sets ends of the redundancy cells 50 connected to the bit lines BL0, BL1, and BL3 on the side of the second driver 21 (13B) at Vsel or Vsel/2 by the second driver 21 (13B). To prevent destruction of the resistance change film RE, the control circuit 14 also sets the word lines WL0 to WL3 at Vsel or Vsel/2 by the first driver 21 (13A).

Furthermore, the control circuit 14 sets an end of the selector cell 50 (represented by X) connected to the word line WL2 on the side of the second driver 21 (13B) at 0V (ground potential) by the second driver 21 (13B).

At this time, for example, the selector cell 50 (represented by X) alone connected to the bit line BL2 is reset irreversibly and fixed in the reset state (high resistive state), i.e., the OFF state. The redundancy cells 50 connected to the other bit lines BL0, BL1, and BL3 are maintained in the initial state, for example, the set state (low resistive state), i.e., the ON state.

It should be noted that the redundancy cells 50 connected to the bit lines BL0, BL1, and BL3 may be fixed in the set state (low resistive state), i.e., the ON state by the irreversible set.

(Conclusion)

According to the above-explained embodiments, the resistance change film can be used as a one-time program memory (fuse or antifuse).

While certain embodiments have been described, these embodiments have been presented by way of example only, and are not intended to limit the scope of the inventions. Indeed, the novel embodiments described herein may be embodied in a variety of other forms; furthermore, various omissions, substitutions, and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor integrated circuit comprising:
  a memory cell including first and second electrodes and a resistance change film therebetween, the resistance change film being reversibly changeable between first and second resistive states; and
  a control circuit controlling a potential difference between the first and second electrodes,
  wherein the control circuit reversibly changes the memory cell to the first resistive state by applying a first potential to the first electrode and by applying a second potential smaller than the first potential to the second electrode,
  the control circuit reversibly changes the memory cell to the second resistive state by applying a third potential to the first electrode and by applying a fourth potential smaller than the third potential to the second electrode, and
  the control circuit irreversibly fixes the memory cell to a third resistive state by applying a fifth potential to the first electrode and by applying a sixth potential greater than the fifth potential to the second electrode.

2. The circuit of claim 1, wherein
a resistance value of the first resistive state is greater than a resistance value of the second resistance state.

3. The circuit of claim 2, wherein
a potential difference between the third and fourth potentials is greater than a potential difference between the first and second potentials.

4. The circuit of claim 1, wherein
an absolute value of a potential difference between the fifth and sixth potentials is greater than an absolute value of a potential difference between the first and second potentials.

5. The circuit of claim 1, wherein
an absolute value of a potential difference between the fifth and sixth potentials is greater than an absolute value of a potential difference between the third and fourth potentials.

6. The circuit of claim 1, wherein
the first and second electrodes include at least one of a metal, a semiconductor, and an alloy, the metal being at least one of Ni, Pt, Au, Ag, Ru, Ir, Co, Ti, Al, Rh, Nb, and W, the semiconductor being at least one of polysilicon and silicide, the alloy being at least one of Titanium-Aluminum-Nitride, Strontium-Ruthenium-Oxide, Ruthenium-Nitride, Titanium-Nitride, Tantalum-Nitride, Lanthanum-Nickel-Oxide, Plutinum-Iridium-Oxide, Plutinum-Rhodium-Oxide, Tantalum-Aluminum-Nitride, and Indium-Tin-Oxide, and
the resistance change film includes at least one of Hafnium oxide, Silicon oxide, Tantalum oxide, Zinc oxide, Titanium oxide, Nickel oxide, and Tungsten oxide.

7. The circuit of claim 1, further comprising:
a word line extending in a first direction;
a bit line extending in a second direction intersecting the first direction;
a first driver driving the word line; and
a second driver driving the bit line, wherein the memory cell is connected between the word line and the bit line.

8. The circuit of claim 1, further comprising:
a first node, a second node, a third node and a fourth node;
a first cell connected between the first and second nodes;
a second cell connected between the first and third nodes;
a first switching element including a first control terminal and switching connection/disconnection between the first and fourth nodes;
a second switching element including a second control terminal connected to the first node;
a first driver connected to the first control terminal; and
a second driver connected to the second and third nodes,
wherein each of the first and second cells comprises the memory cell.

9. The circuit of claim 8, wherein
the first electrode in the first cell and the first electrode in the second cell are connected to the first node,
the second electrode in the first cell is connected to the second node, and
the second electrode in the second cell is connected to the third node.

10. The circuit of claim 8, wherein
the second electrode in the first cell and the second electrode in the second cell are connected to the first node,
the first electrode in the first cell is connected to the second node, and
the first electrode in the second cell is connected to the third node.

11. The circuit of claim 8, wherein
the resistance change film in the first cell has a resistive state different from a resistive state of the resistance change film in the second cell.

12. The circuit of claim 1, further comprising:
a memory cell array including a first cell and a second cell for displacing the first cell when the first cell is defective, by irreversibly fixing the first cell to a fourth resistive state by applying a seventh potential to the first electrode and by applying a eighth potential greater than the seventh potential to the second electrode;
wherein each of the first and second cell comprises the memory cell.

13. The circuit of claim 1, further comprising:
a word line extending in a first direction;
a bit line extending in a second direction intersecting the first direction;
a first driver driving the word line;
a second driver driving the bit line;
a selector cell connected between the word line and the first driver; and
a third driver connected to a node between the word line and the selector cell,
wherein the selector cell comprises the memory cell.

14. A semiconductor integrated circuit comprising:
a memory cell including first and second electrodes and a resistance change film therebetween, the resistance change film being reversibly changeable between first and second resistive states; and
a control circuit controlling a potential difference between the first and second electrodes,
wherein the control circuit reversibly changes the memory cell to the first resistive state by applying a first potential to the first electrode and by applying a second potential smaller than the first potential to the second electrode,
the control circuit reversibly changes the memory cell to the second resistive state by applying a third potential to the first electrode and by applying a fourth potential smaller than the third potential to the second electrode, and
the control circuit irreversibly fixes the memory cell to a third resistive state by applying a fifth potential to the first electrode and by applying a sixth potential smaller than the fifth potential to the second electrode.

15. The circuit of claim 14, wherein
the control circuit irreversibly fixes the memory cell to the fourth resistive state by applying a seventh potential to the first electrode and by applying an eighth potential greater than the seventh potential to the second electrode.

16. The circuit of claim 14, wherein
the memory cell includes a diode serially connected to the resistance change film.

17. The circuit of claim 14, wherein
a resistance value of the first resistive state is greater than a resistance value of the second resistive state.

18. The circuit of claim 14, wherein
the first and second electrodes include at least one of a metal, a semiconductor, and an alloy, the metal being at least one of Ni, Pt, Au, Ag, Ru, Ir, Co, Ti, Al, Rh, Nb, and W, the semiconductor being at least one of polysilicon and silicide, the alloy being at least one of Titanium-Aluminum-Nitride, Strontium-Ruthenium-Oxide, Ruthenium-Nitride, Titanium-Nitride, Tantalum-Nitride, Lanthanum-Nickel-Oxide, Plutinum-Iridium-Oxide, Plutinum-Rhodium-Oxide, Tantalum-Aluminum-Nitride, and Indium-Tin-Oxide, and
the resistance change film includes at least one of Hafnium oxide, Silicon oxide, Tantalum oxide, Zinc oxide, Titanium oxide, Nickel oxide, and Tungsten oxide.

19. The circuit of claim 14, further comprising:
a word line extending in a first direction;
a bit line extending in a second direction intersecting the first direction;
a first driver driving the word line; and
a second driver driving the bit line,
wherein the memory cell is connected between the word line and the bit line.

20. The circuit of claim 14, further comprising:
a first node, a second node, a third node and a fourth node;
a first cell connected between the first and second nodes;
a second cell connected between the first and third nodes;
a first switching element including a first control terminal and switching connection/disconnection between the first and fourth nodes;
a second switching element including a second control terminal connected to the first node;
a first driver connected to the first control terminal; and
a second driver connected to the second and third nodes,
wherein each of the first and second cells comprises the memory cell.

21. The circuit of claim 15, further comprising:
a first node, a second node, a third node and a fourth node;
a first cell connected between the first and second nodes;
a second cell connected between the first and third nodes;
a first switching element including a first control terminal and switching connection/disconnection between the first and fourth nodes;
a second switching element including a second control terminal connected to the first node;
a first driver connected to the first control terminal; and
a second driver connected to the second and third nodes, wherein each of the first and second cells comprises the memory cell, and the resistive state of the resistance change film in the second cell is fixed irreversibly, when the resistive state of the resistance change film in the first cell is fixed irreversibly.

\* \* \* \* \*